(12) United States Patent
Kashima

(10) Patent No.: US 10,985,178 B2
(45) Date of Patent: Apr. 20, 2021

(54) SEMICONDUCTOR MEMORY DEVICE AND METHOD OF MANUFACTURING SEMICONDUCTOR MEMORY DEVICE

(71) Applicant: TOSHIBA MEMORY CORPORATION, Tokyo (JP)

(72) Inventor: Takayuki Kashima, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/530,564

(22) Filed: Aug. 2, 2019

(65) Prior Publication Data
US 2020/0286910 A1    Sep. 10, 2020

(30) Foreign Application Priority Data
Mar. 4, 2019    (JP) .............................. JP2019-038413

(51) Int. Cl.
| | |
|---|---|
| *H01L 27/11582* | (2017.01) |
| *G11C 5/06* | (2006.01) |
| *H01L 27/1157* | (2017.01) |
| *H01L 27/11556* | (2017.01) |
| *H01L 27/11524* | (2017.01) |

(52) U.S. Cl.
CPC ........ *H01L 27/11582* (2013.01); *G11C 5/063* (2013.01); *H01L 27/1157* (2013.01); *H01L 27/11524* (2013.01); *H01L 27/11556* (2013.01)

(58) Field of Classification Search
CPC .......... H01L 27/11582; H01L 27/1157; H01L 27/11556; H01L 27/11524
See application file for complete search history.

(56) References Cited

U.S. PATENT DOCUMENTS

| | | |
|---|---|---|
| 10,020,319 B2 | 7/2018 | Baba |
| 10,074,665 B2 | 9/2018 | Kawaguchi |
| 10,090,320 B2 | 10/2018 | Nogami |
| 2018/0090507 A1 | 3/2018 | Ichinose |
| 2018/0268902 A1 | 9/2018 | Tanaka |
| 2019/0081060 A1 | 3/2019 | Lu et al. |

*Primary Examiner* — Douglas M Menz
(74) *Attorney, Agent, or Firm* — Foley & Lardner LLP

(57) ABSTRACT

According to one embodiment, a semiconductor memory device includes a plurality of first conductor layers stacked in a first direction, a second conductor layer provided above the first conductor layer, a first semiconductor layer extending in the first direction in the plurality of first conductor layers, a second semiconductor layer including a first portion extending in the first direction in the second conductor layer and a second portion of which a diameter in a cross section orthogonal to the first direction is larger than a diameter of the first portion, and being in contact with the first semiconductor layer in the second portion, and a first charge storage layer disposed between the plurality of first conductor layers and the first semiconductor layer. An upper end of the first charge storage layer protrudes upward in the first direction in comparison with an upper end of the first semiconductor layer.

16 Claims, 23 Drawing Sheets

SEMICONDUCTOR MEMORY DEVICE AND METHOD OF MANUFACTURING SEMICONDUCTOR MEMORY DEVICE

CROSS-REFERENCE TO RELATED APPLICATION(S)

This application is based upon and claims the benefit of priority from Japanese Patent Application No. 2019-038413, filed Mar. 4, 2019, the entire contents of which are incorporated herein by reference.

FIELD

Embodiments described herein relate generally to a semiconductor memory device and a method of manufacturing the semiconductor memory device.

BACKGROUND

A NAND flash memory is known as a semiconductor memory device capable of storing data in a nonvolatile manner. In a semiconductor memory device such as the NAND flash memory, a three-dimensional memory structure is adopted for higher integration and higher capacity. In the three-dimensional memory structure, a configuration in which a memory pillar includes connecting two upper and lower pillars is known.

An example of related art includes US-B-10020319.

DETAILED DESCRIPTION

Figure 1:
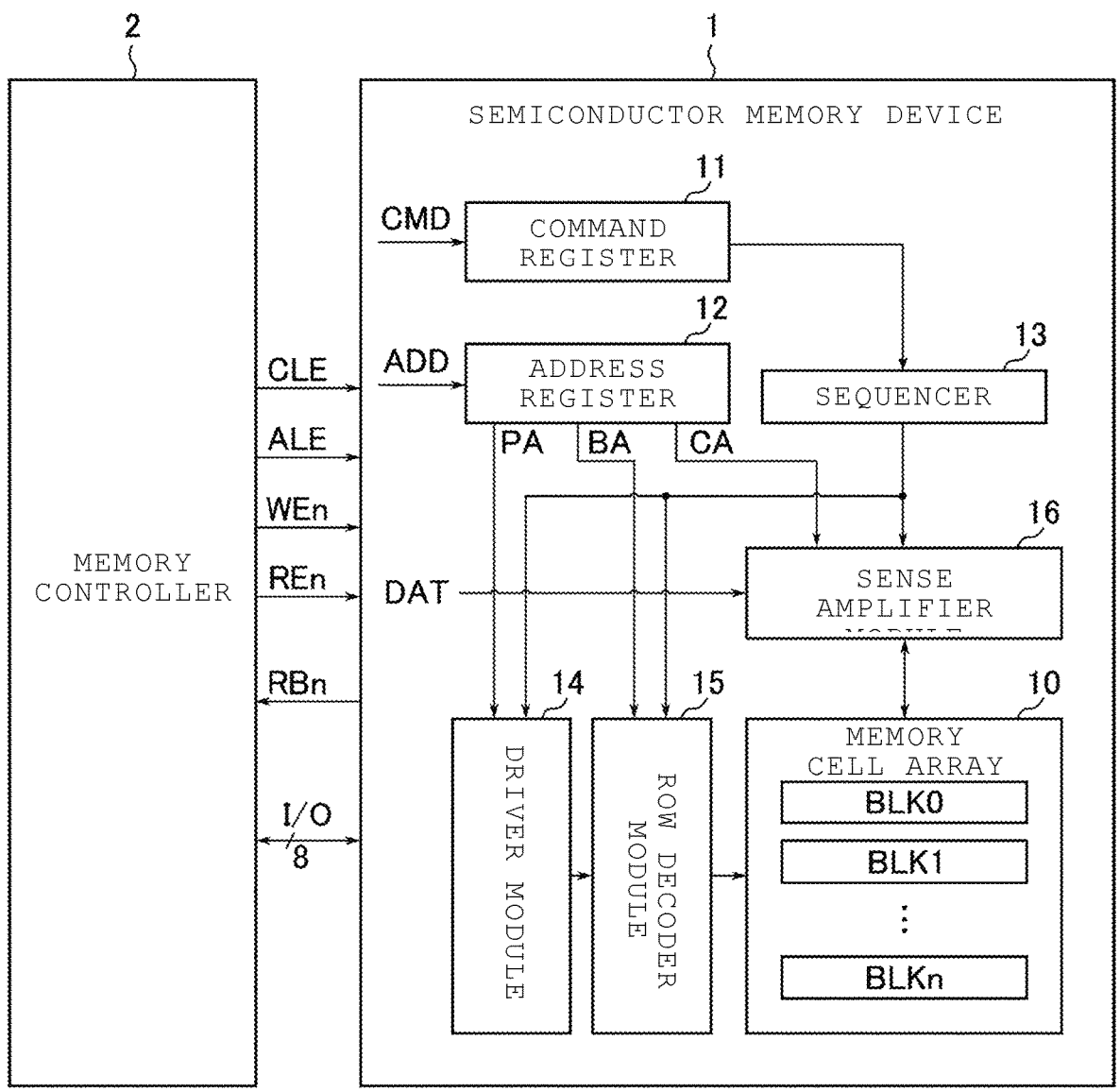
FIG. 1 is a block diagram showing an entire configuration of a memory system including a semiconductor memory device according to a first embodiment.

Embodiments provide a semiconductor memory device and a method of manufacturing the semiconductor memory device capable of improving connection between two upper and lower pillars of a memory pillar.

In general, according to one embodiment, a semiconductor memory device includes a plurality of first conductor layers stacked in a first direction, a second conductor layer provided above the first conductor layer, a first semiconductor layer extending in the first direction in the plurality of first conductor layers, a second semiconductor layer including a first portion extending in the first direction in the second conductor layer and a second portion of which a diameter in a cross section orthogonal to the first direction is larger than a diameter of the first portion, and being in contact with the first semiconductor layer in the second portion, and a first charge storage layer disposed between the plurality of first conductor layers and the first semiconductor layer. An upper end of the first charge storage layer protrudes upward in the first direction in comparison with an upper end of the first semiconductor layer.

Hereinafter, an embodiment will be described with reference to the drawings. Each embodiment illustrates a device or a method for embodying a technical idea of the disclosure. The drawings are schematic or conceptual, and the dimensions and proportions of the drawings are not necessarily the same as the actual ones. The technical concept of the present disclosure is not specified by the shape, structure, placement, and the like of the components.

In the following description, components having substantially the same function and configuration are denoted by the same reference numerals. The numbers after the letters configuring the reference numerals are referred to by the reference numerals including the same letter and are used to distinguish between elements having similar configurations. If it is not necessary to distinguish between elements indicated by reference signs including the same letter, such elements are referred to by reference numerals including only letters, respectively.

1. First Embodiment

A semiconductor memory device according to the first embodiment will be described.

1.1 Configuration

First, a configuration of the semiconductor memory device according to the first embodiment will be described.

1.1.1 Semiconductor Memory Device

FIG. 1 is a block diagram for illustrating the configuration of the semiconductor memory device according to the first embodiment. The semiconductor memory device 1 is a NAND type flash memory capable of storing data in a non-volatile manner, and is controlled by an external memory controller 2. Communication between the semiconductor memory device 1 and the memory controller 2 supports, for example, a NAND interface standard.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer equal to or greater than 1). The block BLK is a set of a plurality of memory cells capable of storing data in a non-volatile manner, and is used, for example, as a data erasure unit. The memory cell array 10 is also provided with a plurality of bit lines and a plurality of word lines. Each memory cell is associated with, for example, one bit line and one word line. The detailed configuration of the memory cell array 10 will be described later.

The command register 11 stores a command CMD received by the semiconductor memory device 1 from the memory controller 2. The command CMD includes, for example, an instruction to cause the sequencer 13 to execute a read operation, a write operation, an erase operation, or the like.

The address register 12 stores address information ADD received by the semiconductor memory device 1 from the memory controller 2. The address information ADD includes, for example, a block address BA, a page address PA, and a column address CA. For example, the block address BA, the page address PA, and the column address CA are used to select the block BLK, the word line, and the bit line, respectively.

The sequencer 13 controls the overall operation of the semiconductor memory device 1. For example, the sequencer 13 controls the driver module 14, the row decoder module 15, the sense amplifier module 16, and the like based on the command CMD stored in the command register 11 to execute the read operation, the write operation, the erase operation, or the like.

The driver module 14 generates voltage to be used in the read operation, the write operation, the erase operation, and the like. The driver module 14 applies the generated voltage to a signal line corresponding to the selected word line based on, for example, the page address PA stored in the address register 12.

The row decoder module 15 selects one block BLK in the corresponding memory cell array 10 based on the block address BA stored in the address register 12. For example, the row decoder module 15 transmits the voltage applied to the signal line corresponding to the selected word line to the selected word line in the selected block BLK.

The sense amplifier module 16 applies desired voltage to each bit line according to write data DAT received from the memory controller 2 in the write operation. In the read operation, the sense amplifier module 16 determines the data stored in the memory cell based on the voltage of the bit line, and transmits a determination result to the memory controller 2 as the read data DAT.

The semiconductor memory device 1 and the memory controller 2 described above may configure one semiconductor device by a combination thereof. Examples of such a semiconductor device include a memory card such as an SD™ card, a solid state drive (SSD), and the like.

1.1.2 Circuit Configuration of Memory Cell Array

Figure 2:
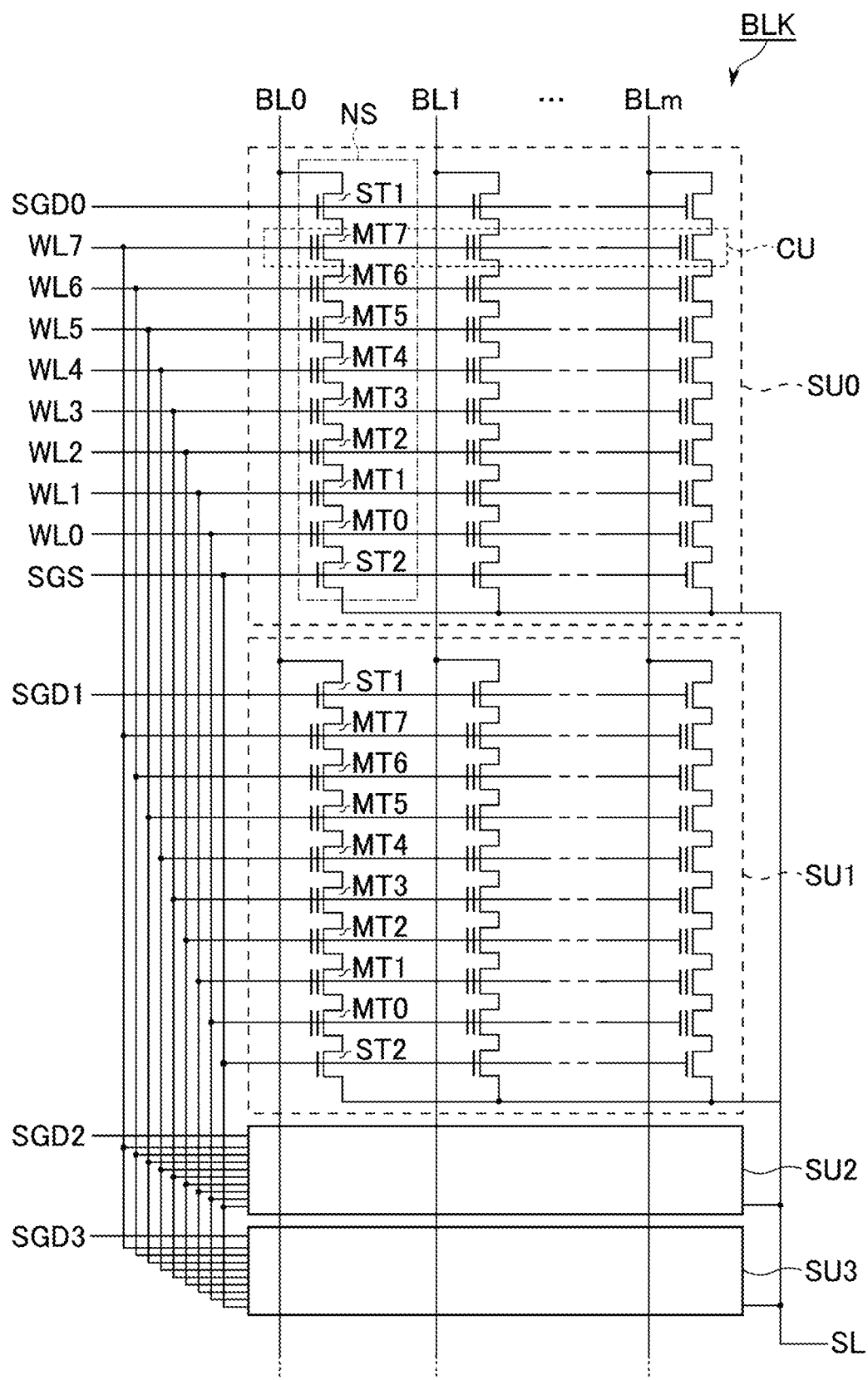
FIG. 2 is a circuit diagram showing a portion of a memory cell array of the semiconductor memory device of the first embodiment.

FIG. 2 is a circuit diagram illustrating a configuration of the memory cell array of the semiconductor memory device according to the first embodiment. FIG. 2 shows one block BLK among the plurality of blocks BLK in the memory cell array 10.

As shown in FIG. 2, the block BLK includes, for example, four string units SU0 to SU3. Each string unit SU includes a plurality of NAND strings NS respectively associated with bit lines BL0 to BLm (m is an integer equal to or greater than 1). Each NAND string NS includes, for example, memory cell transistors MT0 to MT7, and select transistors ST1 and ST2. The memory cell transistor MT includes a control gate and a charge storage layer, and stores data in a non-volatile manner. Each of select transistors ST1 and ST2 is used to select the string unit SU during various operations.

In each NAND string NS, the memory cell transistors MT0 to MT7 are connected with each other in series. A drain of the select transistor ST1 is connected to an associated bit line BL, and a source of the select transistor ST1 is connected to one end of the memory cell transistors MT0 to MT7 that are connected with each other in series. A drain of the select transistor ST2 is connected to the other end of the memory cell transistors MT0 to MT7 that are connected with each other in series. A source of the select transistor ST2 is connected to the source line SL.

In the same block BLK, control gates of the memory cell transistors MT0 to MT7 of each of the string units SU0 to SU3 are connected to the word lines WL0 to WL7, respectively. The gates of the select transistors ST1 of each of the string units SU0 to SU3 are connected to select gate lines SGD0 to SGD3, respectively. The gates of the select transistors ST2 of each of the string units SU0 to SU3 are connected to a select gate line SGS.

In the circuit configuration of memory cell array 10 described above, the bit line BL is shared by the NAND strings NS to which the same column address is allocated in each string unit SU. The source line SL is shared, for example, among the plurality of blocks BLK.

A set of the memory cell transistors MT connected to a common word line WL in one string unit SU is referred to as, for example, a cell unit CU. For example, a storage capacity of the cell unit CU including the memory cell transistors MT each storing 1-bit data is defined as "one page data". The cell unit CU may have a storage capacity equal to or greater than two page data, according to the number of bits of the data stored in the memory cell transistor MT.

The circuit configuration of the memory cell array 10 provided in the semiconductor storage device 1 according to the first embodiment is not limited to the configuration described above. For example, the number of the memory cell transistors MT and the number of the select transistors ST1 and ST2 in each NAND string NS may be designed to be any number. The number of the string units SU in each block BLK may be designed to be any number.

1.1.3 Structure of Memory Cell Array

Hereinafter, an example of the structure of the memory cell array of the semiconductor memory device according to the first embodiment will be described.

In the drawings referred to below, an X direction corresponds to an extending direction of the word line WL, a Y direction corresponds to an extending direction of the bit line BL, and a Z direction corresponds to a vertical direction regarding a surface of a semiconductor substrate 20 on which the semiconductor memory device 1 is formed. In a plan view, hatching is appropriately added to make the drawing easy to see. The hatching added to the plan view is not necessarily related to a material or a characteristic of the hatched component. In a cross-sectional view, components such as an insulator layer (interlayer insulating film), a wire, and a contact are appropriately omitted to make the drawing easy to see.

Figure 3:
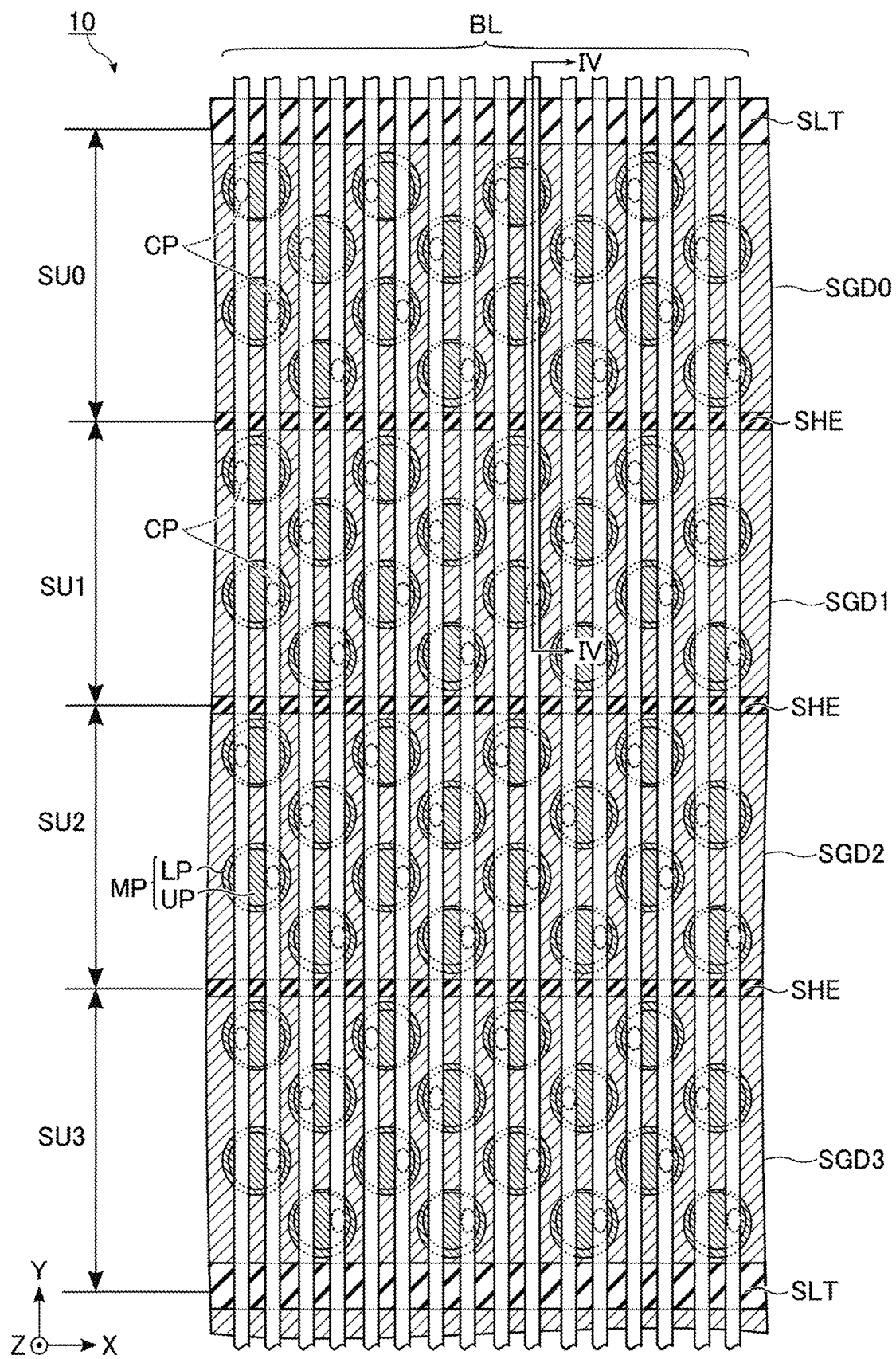
FIG. 3 is a plan view of the memory cell array of the semiconductor memory device of the first embodiment as viewed from above.

FIG. 3 is a plan view for illustrating a planar layout of the memory cell array of the semiconductor memory device according to the first embodiment. In FIG. 3, as an example, a part of a region including a structure corresponding to the string units SU0 to SU3 in a certain block BLK is shown.

As shown in FIG. 3, the memory cell array 10 includes, for example, a plurality of slits SLT and SHE, a memory pillar MP, a contact CP, and the bit lines BL, and conductor layers 21 to 24 which will be described later with reference to FIG. 4.

Each of the plurality of slits SLT extends in a predetermined direction (the X direction in FIG. 3) of the memory cell array plane and is provided in a direction intersecting with the predetermined direction (the Y direction that is orthogonal to the X direction in FIG. 3). Each of the plurality of slits SHE also extends in the X direction and is provided in the Y direction between adjacent slits SLT. A width of the slit SLT (along the Y direction) is, for example, wider than a width of the slit SHE (along the Y direction). Each of the slits SLT and SHE includes an insulator. The slit SLT divides, for example, wire layers such as the word line WL, the select gate line SGD, and the select gate line SGS which will be described later with reference to FIG. 4. That is, the slit SLT insulates and separates the string units SU0 to SU3 and other string units (not shown) adjacent to the string units SU0 to SU3. The slit SHE divides, insulates, and separates the select gate lines SGD (stacked wire layers) corresponding to each of the string units SU0 to SU3 from each other.

As described above, regions separated by the slits SLT and SHE configure each of the string units SU0 to SU3. As the entire memory cell array 10, a layout similar to the layout shown in FIG. 3 is repeatedly provided in the X direction and the Y direction.

In FIG. 3, for example, a plurality of memory pillars MP are arranged in a zigzag shape of 16 rows in a region between the adjacent slits SLT that includes four string units SU0 to SU3. The 16 rows may be equally distributed across the four string units SU0 t0 SU3. For example, in each of the string units SU0 to SU3, the plurality of memory pillars MP are arranged in a zigzag shape in four rows. Each of the plurality of memory pillars MP is provided with a portion (lower pillar LP) formed in a memory hole MH and a portion (upper pillar UP) formed in an SGD hole SH. The upper pillar UP is provided above the lower pillar LP, and, for example, the upper pillar UP has a diameter smaller than that of the lower pillar LP.

That is, there is an overlapping portion between a set of the corresponding upper pillar UP and lower pillar LP in a plan view of the memory cell array plane from above. In the plan view, a center (axis) of the corresponding upper pillar UP and a center (axis) of the lower pillar LP may or may not overlap. The center (axis) is herein defined as an axis passing through an intersection point of any two diameters in any XY cross section of the upper pillar UP and the lower pillar LP in the Z direction. The any XY cross section is, for example, a surface with which the upper pillar UP and the lower pillar LP are in contact. In the plan view of FIG. 3, the lower pillar LP is disposed so as not to overlap the slit SHE. The memory pillar MP disposed nearby the slit SHE or the slit SLT is disposed so that the axis of the upper pillar UP is shifted in a direction away from the nearby slit SHE or SLT regarding the axis of the lower pillar LP. As described above, in the semiconductor memory device 1 according to the first embodiment, the layout in which the contact between the slit SHE or SLT and the memory pillar MP is avoided may be designed.

As shown in FIG. 3, each of the plurality of bit lines BL extends in the Y direction and is arranged in the X direction. Each bit line BL is disposed so as to overlap at least one upper pillar UP for each string unit SU in a plan view. Further, for each string unit SU in the plan view, two bit lines BL overlap each upper pillar UP. The contact CP is provided between one of the plurality of bit lines BL overlapping the upper pillar UP and the corresponding upper pillar UP. The string unit SU is electrically connected to the corresponding bit line BL through the contact CP formed in the upper pillar UP.

The planar layout of the memory cell array 10 described above is merely an example, and the present disclosure is not limited thereto. For example, the number of the slits SHE disposed between adjacent slits SLT and the number of the string units SU may be freely designed. The number or arrangement of the memory pillars MP, the bit line BL connected to the memory pillar MP, and the like may also be freely designed.

Figure 4:
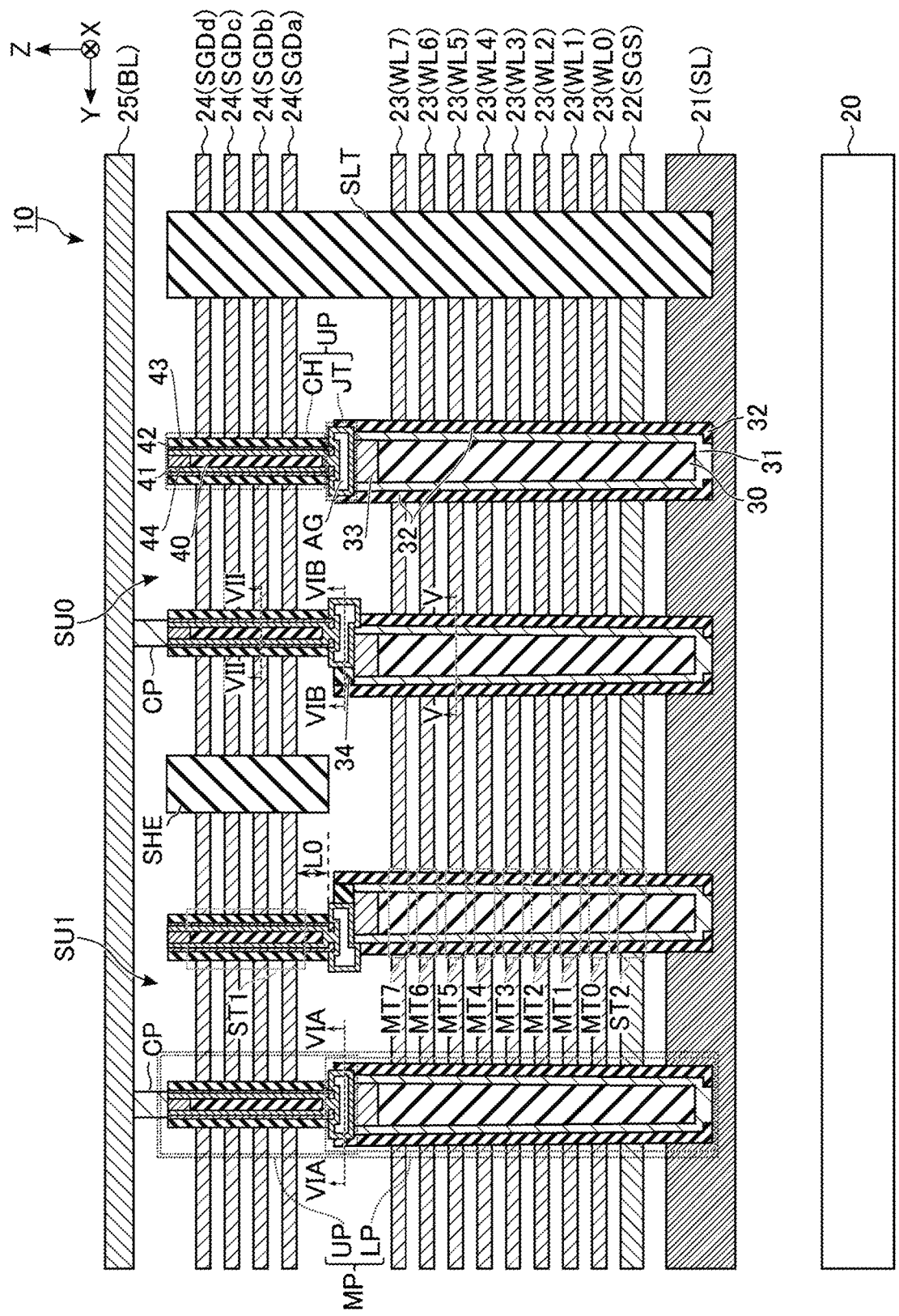
FIG. 4 is a cross-sectional view of the memory cell array along a line IV-IV of FIG. 3.

FIG. 4 shows an example of a cross-sectional structure in which the memory cell array 10 of the semiconductor memory device according to the first embodiment of FIG. 3 is taken along a line IV-IV. As shown in FIG. 4, a conductor layer 21 is provided above the semiconductor substrate 20 through an insulator layer (not shown). The insulator layer may be provided with a circuit such as the sense amplifier module 16 or the like. For example, the conductor layer 21 is formed in a plate shape extended along the XY plane, and becomes the source line SL. The conductor layer 21 includes, for example, silicon (Si).

A conductor layer 22 is provided above the conductor layer 21 through an insulator layer (not shown). The conductor layer 22 is used as the select gate line SGS.

A plurality of insulator layers (not shown) and a conductor layer 23 are alternately stacked above the conductor layer 22. The conductor layer 23 is used as, for example, the word lines WL0 to WL7 sequentially from a side of the semiconductor substrate 20. The conductor layers 22 and 23 are formed, for example, in a plate shape extended along the XY plane, and include, for example, tungsten (W).

A plurality of insulator layers (not shown) and a conductor layer 24 are alternately stacked above the conductor layer 23 stacked in the uppermost layer. A distance in the Z direction between the conductor layer 23 of the uppermost layer and the conductor layer 24 of the lowermost layer is longer than a distance in the Z direction between adjacent conductor layers 23 or between the adjacent conductor layers 24. That is, a thickness of the insulator layer (INS, not shown) between the conductor layer 23 of the uppermost layer and the conductor layer 24 of the lowermost layer is thicker than a thickness between the adjacent conductor layers 23 or between the adjacent conductor layers 24. The plurality of stacked conductor layers 24 are used as select gate lines SGDa, SGDb, SGDc, and SGDd sequentially from the side of the semiconductor substrate 20, and select transistors are provided in portions of the upper pillars UP corresponding to each of the select gate lines. The conductor layer 24 is formed, for example, in a plate shape extended along the XY plane, and includes, for example, tungsten (W).

A conductor layer 25 is provided above the conductor layer 24 stacked in the uppermost layer sandwiching an insulator layer (not shown). For example, the conductor layer 25 extends along the Y direction, a plurality of the conductor layers 25 are arranged in a line shape in the X direction, and each of the conductor layers 25 is used as the bit line BL. The conductor layer 25 includes, for example, copper (Cu).

The memory pillar MP extends along the Z direction and is provided. Specifically, the lower pillar LP of the memory pillar MP penetrates the conductor layers 22 and 23, and a bottom portion is in contact with the conductor layer 21. The upper pillar UP of the memory pillar MP penetrates the conductor layer 24 and is in contact with the lower pillar LP.

The lower pillar LP of the memory pillar MP includes, for example, a core member 30, a semiconductor layer 31, a stacked film 32, a semiconductor portion 33, and an insulator portion 34. The upper pillar UP includes, for example, a core member 40, a semiconductor layer 41, a semiconductor layer 42, a stacked film 43, and a semiconductor portion 44. The upper pillar UP is formed so that a part of the semiconductor layer 41 is embedded in an upper end of the lower pillar LP, and thus electrical connection with the lower pillar LP is improved.

The core member 30 of the lower pillar LP extends along the Z direction, an upper end thereof is located, for example, above the conductor layer 23 of the uppermost layer, and a lower end of the core member 30 of the upper pillar UP is located, for example, in a layer of the conductor layer 21. For example, the core member 30 includes an insulator such as silicon oxide (SiO$_2$).

The semiconductor layer 31 covers a bottom surface and a side surface of the core member 30, and includes, for example, a cylindrical portion. A lower end of the semiconductor layer 31 is in contact with the conductor layer 21, and an upper end thereof is located above the conductor layer 23 of the uppermost layer and below an upper end of the staked film 32. That is, the uppermost end of the upper end of the stacked film 32 in any cross section including the Z direction is located above in the Z direction compared to the uppermost end of the upper end of the semiconductor layer 31 in any cross section including the Z direction. In other words, the upper end of the stacked film 32 protrudes in a Z axis upward direction compared to the upper end of the semiconductor layer 31. In other words, the upper end of the semiconductor layer 31 recedes in a Z axis downward direction compared to the upper end of the stacked film 32.

The stacked film 32 covers a side surface and a bottom surface of the semiconductor layer 31 except for the portion with which the conductor layer 21 and the semiconductor layer 31 are in contact, and includes, for example, a cylindrical portion. A layer structure of the stacked film 32 will be described in detail referring to FIG. 5.

The semiconductor portion 33 covers an upper surface of the core member 30 and is in contact with an inner wall portion of the semiconductor layer 31 above the core member 30 and the lower end of the semiconductor layer 41 formed directly on the semiconductor portion 33. The semiconductor portion 33 has, for example, a cylindrical shape.

In the cross-sectional view of FIG. 4, the memory pillar MP provided with the insulator portion 34 is present nearby a boundary where the upper pillar UP and the lower pillar LP are in contact with each other, specifically, an upper surface of the semiconductor portion 33 above the lower pillar LP. The insulator portion 34 covers a part of upper surfaces of the semiconductor layer 31 and the semiconductor portion 33 and is in contact with the semiconductor layer 41. An upper end of the insulator portion 34 reaches the upper end of the stacked film 32 of the lower pillar LP.

Whether the insulator portion 34 is present depends on a size of a deviation between the centers (axes) of the lower pillar LP and the upper pillar UP (hereinafter, also referred to as "deviation of axes between upper and lower pillars" for simplicity). For example, in the cross-sectional view of FIG. 4, since the deviation of axes between upper and lower pillars of two memory pillars MP in the center is large, the insulator portions 34 are present on the semiconductor portion 33 above the lower pillar LP. Since the deviation of axes of the memory pillars MP at both sides thereof is small, the insulator portion 34 is not present on the semiconductor portion 33 above the lower pillar LP. The insulator portion 34 includes, for example, an insulator such as silicon oxide or silicon nitride (SiN).

The core member 40 is provided to extend along the Z direction. A lower end of the core member 40 is located between the conductor layer 23 of the uppermost layer and the conductor layer 24 of the lowermost layer. An upper end of the core member 40 is located above a layer on which the conductor layer 24 of the uppermost layer is provided.

The semiconductor layer 41 covers a side surface and a bottom surface of the core member 40. The semiconductor layer 41 includes a portion CH intersecting with the conductor layer 24 on the side surface of the core member 40 and a portion JT in contact with the lower pillar LP below the core member 40. The portion CH of the semiconductor layer 41 extends along the Z direction and reaches an upper end of the upper pillar UP. The portion JT of the semiconductor layer 41 is provided with a portion that extends outward (e.g., horizontally, along the Y direction) from the center of the upper pillar UP with respect to the portion CH of the semiconductor layer 41, and includes an air gap AG therein. A distance L0 between an upper end of the portion CH of the semiconductor layer 41 and a lower end of the conductor layer 24 of the lowermost layer is designed to be larger than a predetermined distance.

As described above, the diameter of the upper pillar UP is formed to be smaller than the diameter of the lower pillar LP. Therefore, a film thickness of the semiconductor layer 41 is formed to be thinner than a film thickness of the semiconductor layer 31.

The semiconductor layer 42 covers a side surface of the portion CH of the semiconductor layer 41 and includes a cylindrical portion. A lower end of the semiconductor layer reaches an upper end of the portion JT of the semiconductor layer 41, and an upper end of the semiconductor layer 42 reaches the upper end of the upper pillar UP.

The stacked film 43 is a gate insulating film of the select transistor, covers a side surface of the semiconductor layer 42, and includes a cylindrical portion. The layer structure of the stacked film 43 will be described in detail referring to FIG. 7.

The semiconductor portion 44 covers an upper surface of the core member 40 and is in contact with an inner wall of a portion provided above the core member 40 in the portion CH of the semiconductor layer 41. The semiconductor portion 44 is provided, for example, in a cylindrical shape, and reaches the upper end of the upper pillar UP.

The contact CP of a column shape is provided on upper surfaces of the semiconductor layer 41, the semiconductor layer 42, and the semiconductor portion 44 in the memory pillar MP. In the cross-sectional view of FIG. 4, contacts CP corresponding to two memory pillars MP among four memory pillars MP are shown. Contacts CP for the remaining two memory pillars MP, which are not shown in the drawing, are provided on the side in front of or behind the cross section of FIG. 4. Upper surfaces of each contact CP are in contact with and electrically connected to one corresponding conductor layer 25 (the bit line BL).

For example, the slit SLT is formed in a plate shape extending along an XZ plane that extends in the X direction and the Z direction, and divides the conductor layers 22 to 24. An upper end of the slit SLT is located between the conductor layer 24 and the conductor layer 25. A lower end of the slit SLT is located, for example, on a layer on which the conductor layer 21 is provided. For example, the slit SLT includes an insulator such as silicon oxide.

For example, the slit SHE is formed in a plate shape extending along the XZ plane, and divides the conductor layer 24. An upper end of the slit SHE is located between the conductor layer 24 and the conductor layer 25. For example, a lower end of the slit SHE is located between a layer on which the conductor layer 23 of the uppermost layer is provided and a layer on which the conductor layer 24 is provided. For example, the slit SHE includes an insulator such as silicon oxide.

The upper end of the slit SLT, the upper end of the slit SHE, and the upper end of the memory pillar MP may or may not be aligned.

Figure 5:
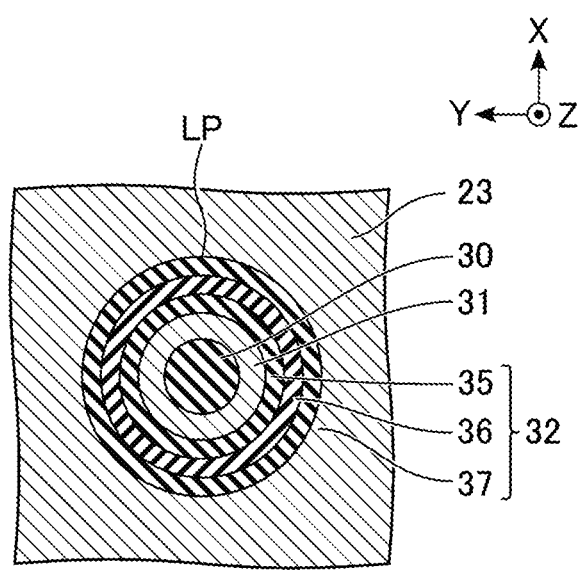
FIG. 5 is a cross-sectional view of a lower portion of a memory pillar along a line V-V of FIG. 4.

FIG. 5 is an XY cross-sectional view of the memory pillar MP of FIG. 4 taken along the line V-V, and shows an example of a cross-sectional structure including the lower pillar LP and the conductor layer 23 around the lower pillar LP.

As shown in FIG. 5, the core member 30 is provided substantially at a center of the lower pillar LP. The semiconductor layer 31 and the stacked film 32 are provided concentrically around the core member 30. That is, the semiconductor layer 31 and the stacked film 32 are formed along the Z direction so as to surround the entire side surface of the core member 30. The stacked film 32 is a film in which a tunnel insulating film 35, an insulating film 36, and a block insulating film 37 are sequentially stacked.

Each of the tunnel insulating film 35 and the block insulating film 37 includes, for example, silicon oxide, and the insulating film 36 includes, for example, silicon nitride (SiN).

Figure 6A:
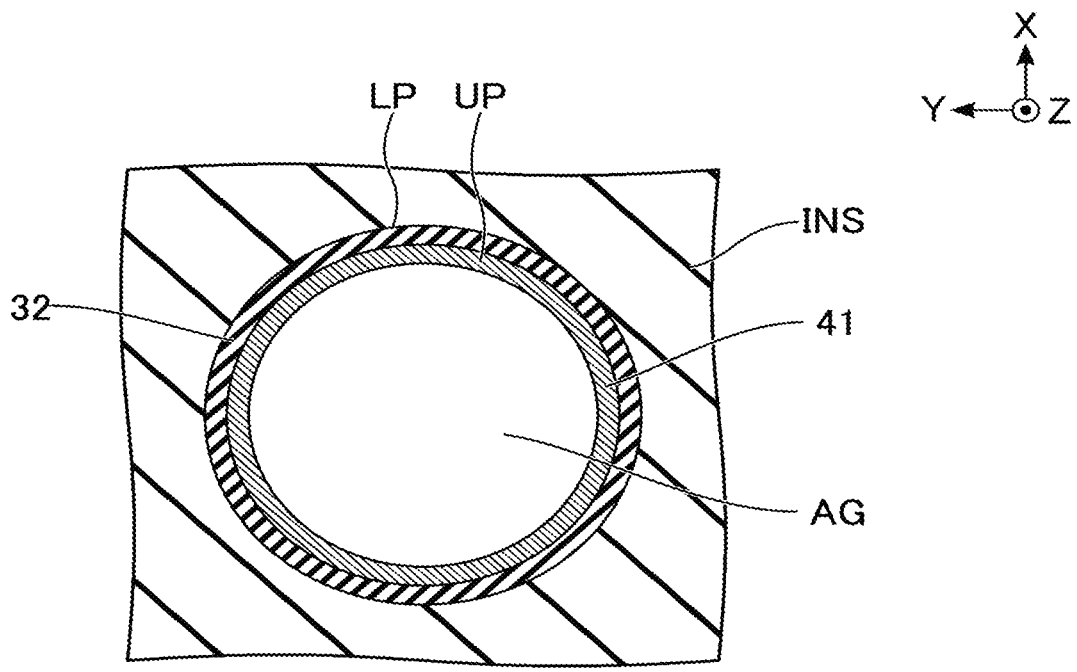
FIGS. 6A and 6B are cross-sectional views of a connection portion between an upper portion and a lower portion of the memory pillar along lines VIA-VIA and VIB-VIB of FIG. 4.
Figure 6B:
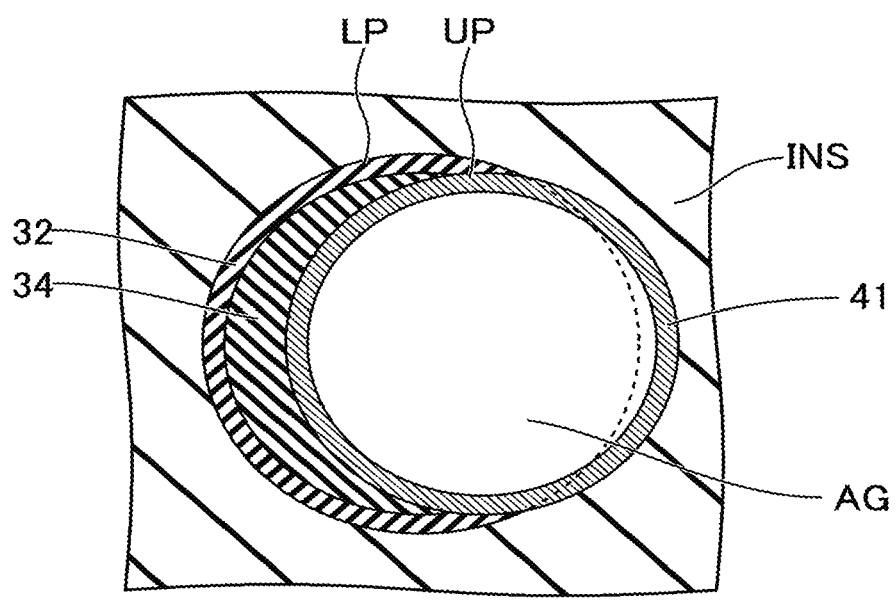

FIGS. 6A and 6B are XY cross-sectional views of the memory pillar MP of FIG. 4 taken along lines VIA-VIA and VIB-VIB, respectively, and are examples of a cross-sectional structure of the memory pillar MP near a portion JT where the semiconductor layer 41 of the upper pillar UP is contact with the lower pillar LP. FIG. 6A shows a case in which there is almost no deviation of axes between the upper and lower pillars, and FIG. 6B shows a case in which the deviation of axes between the upper and lower pillars is large.

As shown in FIG. 6A, when there is almost no deviation of axes between the upper and lower pillars, for example, the air gap AG in the semiconductor layer 41 is formed substantially at the center of the upper pillar UP. As described above, since the diameter of the upper pillar UP is formed to be smaller than the diameter of the lower pillar LP, when there is almost no deviation of axes between the upper and lower pillars, a periphery of the side surface of the semiconductor layer 41 of the upper pillar UP is surrounded by the stacked film 32 of the lower pillar LP, and the stacked film 32 is surrounded by a nearby interlayer insulating film INS. That is, when the upper pillar UP and the lower pillar LP are viewed in plan from an upper side of the semiconductor substrate 20, the entire upper pillar UP (the portion CH and the portion JT) is formed to fit in the cross section of the lower pillar LP, in particular, in the region surrounded by the stacked film 32.

As shown in FIG. 6B, even when the deviation of axes between the upper and lower pillars is large, the air gap AG is formed substantially at the center of the upper pillar UP. On the other hand, the periphery of the side surface of the semiconductor layer 41 includes a portion that is in contact with the insulator portion 34, a portion that is in contact with the stacked film 32 surrounding the side surface of the insulator portion 34, or a portion that is in contact with the interlayer insulating film INS nearby the stacked film 32. That is, when the upper pillar UP and the lower pillar LP are viewed in plan from the upper side of the semiconductor substrate 20, the entire upper pillar UP (the portion CH and the portion JT) does not fit in the cross section of the lower pillar LP, and a part of the upper pillar UP is formed outside the cross section.

Figure 7:
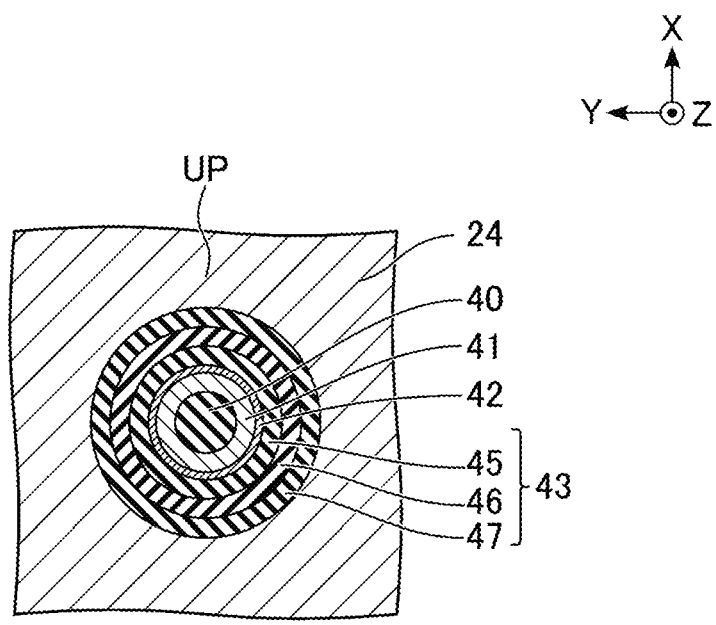
FIG. 7 is a cross-sectional view of the upper portion of the memory pillar along a line VII-VII of FIG. 4.

FIG. 7 is an XY cross-sectional view of the memory pillar MP of FIG. 4 taken along a line VII-VII, and shows an example of a cross-sectional structure of the upper pillar UP.

As shown in FIG. 7, the core member 40 is provided substantially at the center of the upper pillar UP. The semiconductor layer 41, the semiconductor layer 42, and the stacked film 43 are provided concentrically around the core member 40. That is, the semiconductor layer 41, the semiconductor layer 42, and the stacked film 43 are formed along the Z direction so as to surround the entire side surface of the core member 40. The stacked film 43 is a film in which a tunnel insulating film 45, an insulating film 46, and a block insulating film 47 are sequentially stacked.

Each of the tunnel insulating film 45 and the block insulating film 47 includes, for example, silicon oxide, and the insulating film 46 includes, for example, silicon nitride (SiN).

In the structure of the memory pillar MP described above, a portion where the memory pillar MP and the conductor layer 22 intersect with each other functions as the select transistor ST2. A portion where the memory pillar MP and the conductor layer 23 intersect with each other functions as the memory cell transistor MT. A portion where the memory pillar MP and the conductor layer 24 intersect with each other functions as the select transistor ST1.

That is, the semiconductor layer 31 is used as a channel of each of the memory cell transistor MT and the select transistor ST2. The insulating film 36 is used as a charge storage layer of the memory cell transistor MT and the select transistor ST2. The semiconductor layer 41 is used as a channel of the select transistor ST1 and an electrical connection portion between the upper pillar UP and the lower pillar LP. The insulating film 46 is used as a charge storage layer of the select transistor ST1. Therefore, each of the memory pillars MP functions as, for example, one NAND string NS.

The structure of the memory cell array 10 described above is merely an example, and the memory cell array 10 may have other structures. For example, the number of conductor layers 23 is designed based on the number of word lines WL. Each of a plurality of conductor layers 22 and 24 provided in a plurality of layers may be allocated to the select gate lines SGS and SGD. If the select gate lines SGS and SGD are provided in the plurality of layers, a conductor different from the conductor layers 22 and 24 may be used. The memory pillar MP and the conductor layer 25 may be electrically connected through two or more contacts, or may be electrically connected through other wires. The inside of the slit SLT may include a plurality of types of insulators.

1.2 Method of Manufacturing Semiconductor Memory Device

Hereinafter, an example of a series of manufacturing processes from formation of a stacked structure corresponding to the word line WL to formation of the select gate line SGD in the semiconductor memory device according to the first embodiment will be described. Each of FIGS. 8 to 22 shows an example of a cross-sectional structure including a structure corresponding to the memory cell array in the manufacturing process of the semiconductor memory device according to the first embodiment. The cross-sectional view of the manufacturing process referred to below includes a cross section perpendicular to the surface of the semiconductor substrate 20. A region displayed in the cross-sectional view of each manufacturing process includes a region in which two memory pillars MP and each of the slits SLT and SHE are formed.

Figure 8:
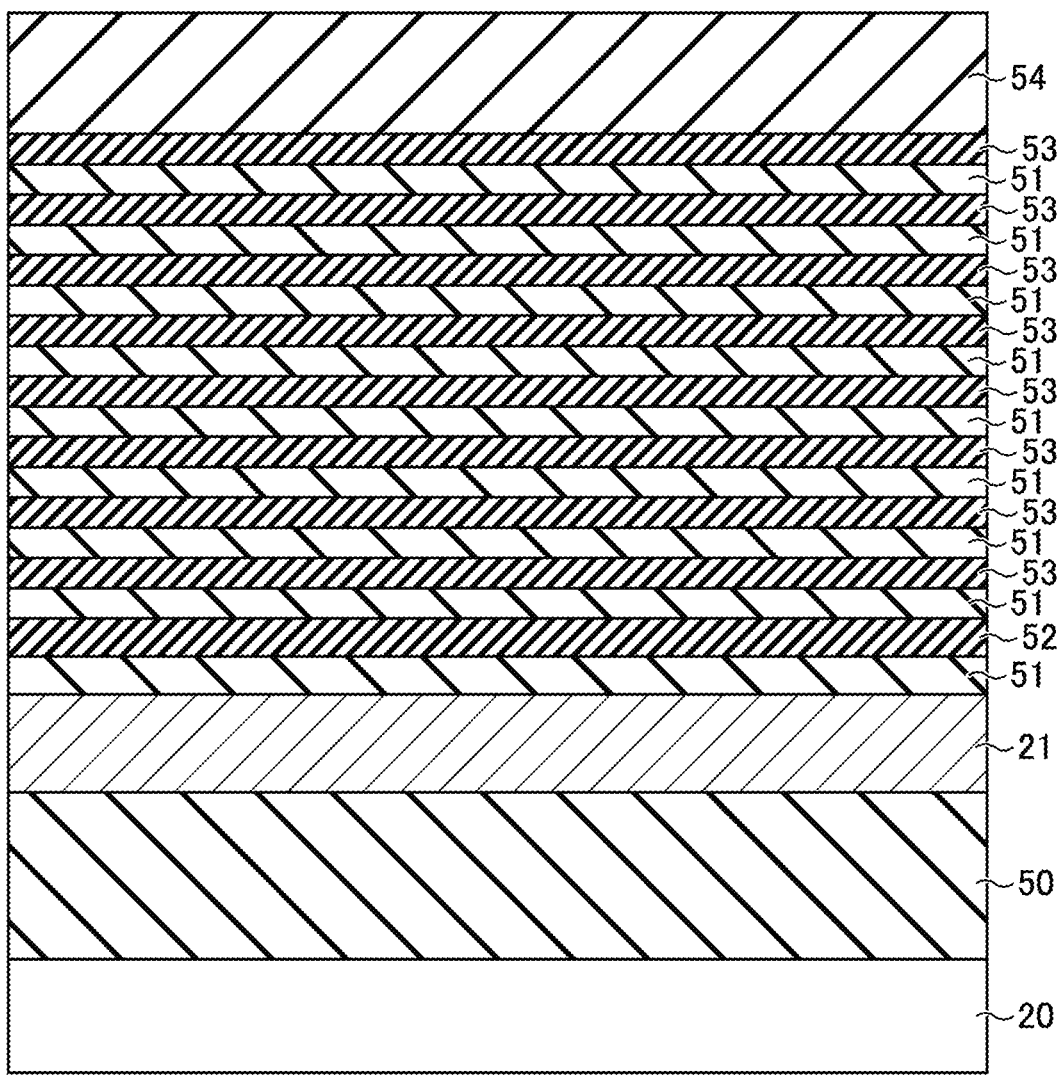
FIG. 8 is a cross-sectional view of the memory cell array illustrating a manufacturing process of the semiconductor memory device of the first embodiment.

First, as shown in FIG. 8, a sacrificial material 52 corresponding to the select gate line SGS and a sacrificial material 53 corresponding to the word line WL are stacked. Specifically, first, an insulator layer 50 and the conductor layer 21 are sequentially stacked on the semiconductor substrate 20. Thereafter, an insulator layer 51 and the sacrificial material 52 are stacked on the conductor layer 21, and the insulator layer 51 and the sacrificial material 53 are alternately stacked plural times on the sacrificial material 52. An insulator layer 54 is stacked on the sacrificial material 53 of the uppermost layer. The insulator layers 51 and 54 include, for example, silicon oxide ($SiO_2$). The number of layers in which the sacrificial materials 52 and 53 are formed corresponds to the number of select gate lines SGS and the word lines WL to be stacked, respectively. The sacrificial materials 52 and 53 include, for example, silicon nitride (SiN).

Figure 9:
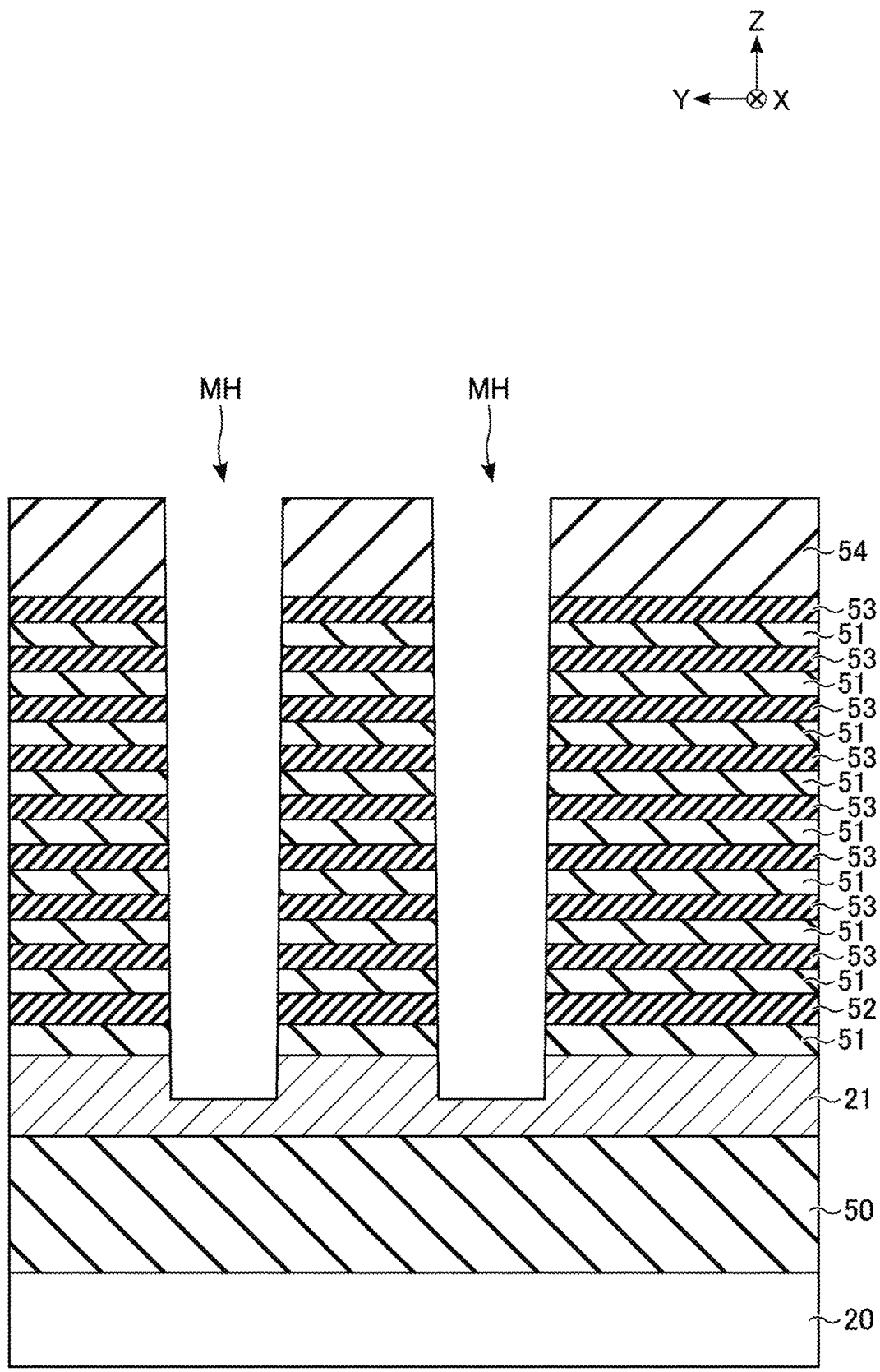
FIG. 9 is a cross-sectional view of the memory cell array illustrating the manufacturing process of the semiconductor memory device of the first embodiment.

Next, as shown in FIG. 9, the memory hole MH corresponding to the lower pillar LP is formed. Specifically, first, a mask including an opening in a region corresponding to the memory hole MH is formed by photolithography or the like. The memory hole MH is formed by anisotropic etching using the formed mask.

The memory hole MH formed in the present process penetrates each of the insulator layer 51, the sacrificial materials 52 and 53, and the insulator layer 54, and reaches the conductor layer 21. The anisotropic etching in the present process is, for example, reactive ion etching (RIE).

Figure 10:
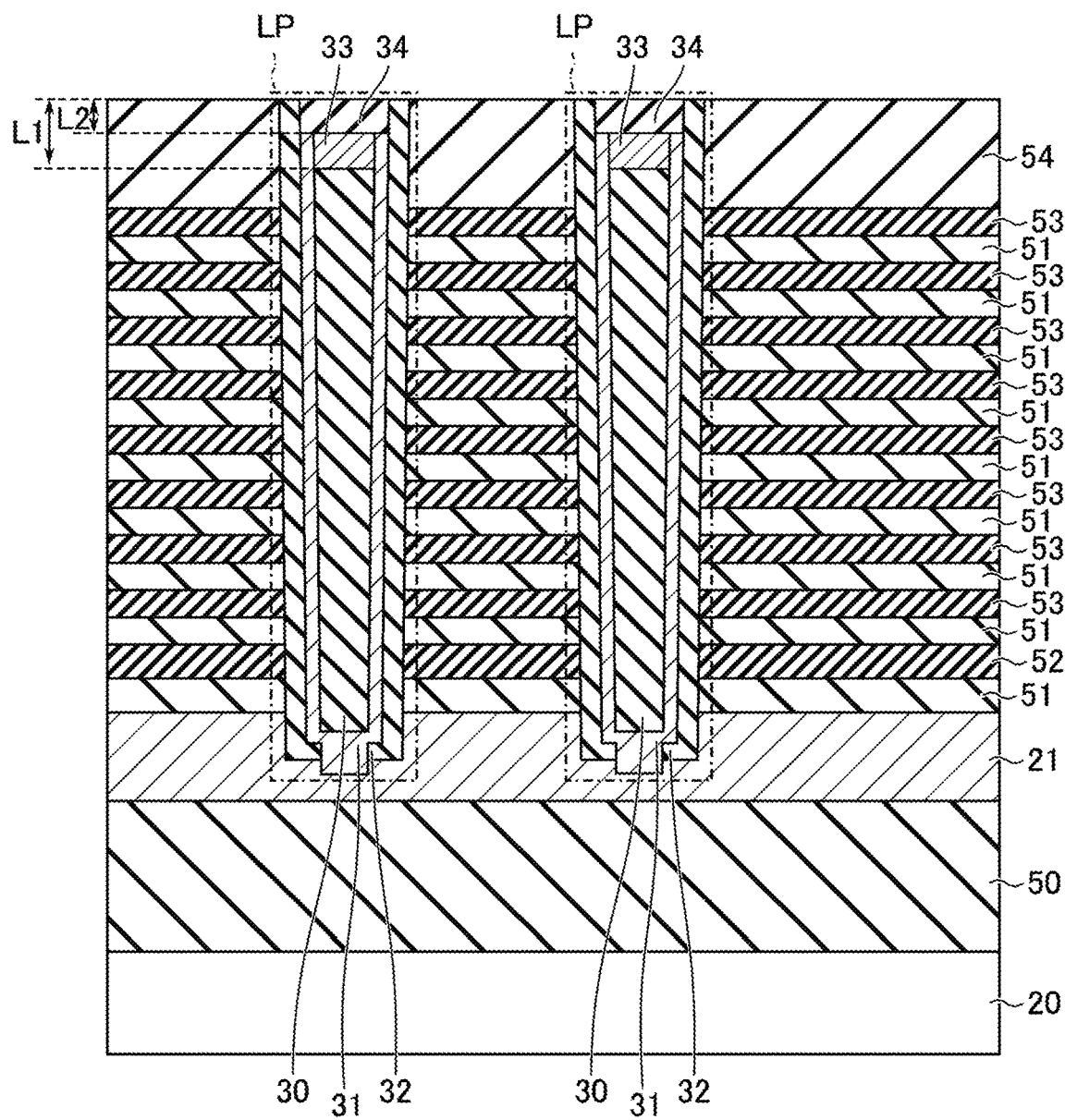
FIG. 10 is a cross-sectional view of the memory cell array illustrating the manufacturing process of the semiconductor memory device of the first embodiment.

Next, as shown in FIG. 10, the stacked structure in the memory hole MH, that is, the lower pillar LP is formed.

Specifically, the block insulating film 37, the insulating film 36, and the tunnel insulating film 35 are sequentially formed on the side surface and the bottom surface of the memory hole MH and the upper surface of the insulating layer 54 to form the stacked film 32. After removing the stacked film 32 at the bottom portion of the memory hole MH, a portion of the conductor layer 21 may be exposed. In some embodiments, the exposed portion of the conductor layer 21 may be recessed below a lower end of the stacked film 32. The semiconductor layer 31 and the core member 30 are sequentially formed over the stacked film 32, such that the inside of the memory hole MH is buried (e.g., filled with the semiconductor layer 31 and the core member 30). Thereafter, the core member 30 from the upper end of memory hole MH to the depth L1 is removed together with a portion remaining on a layer higher than the insulator layer 54.

Subsequently, the semiconductor portion 33 is formed, and the inside of the memory hole MH is buried. Thereafter, the semiconductor portion 33 and the semiconductor layer 31 from the upper end of the memory hole MH to a depth L2 (<L1) are removed together with the semiconductor portion 33 and the semiconductor layer 31 remaining on a layer higher than the insulator layer 54. The stacked film 32 remaining on a layer higher than the insulator layer 54 is also removed.

Subsequently, the insulator portion 34 is formed, and the inside of the memory hole MH is buried. Thereafter, the insulator portion 34 remaining on a layer higher than the insulator layer 54 is removed.

Therefore, the lower pillar LP is formed.

Figure 11:
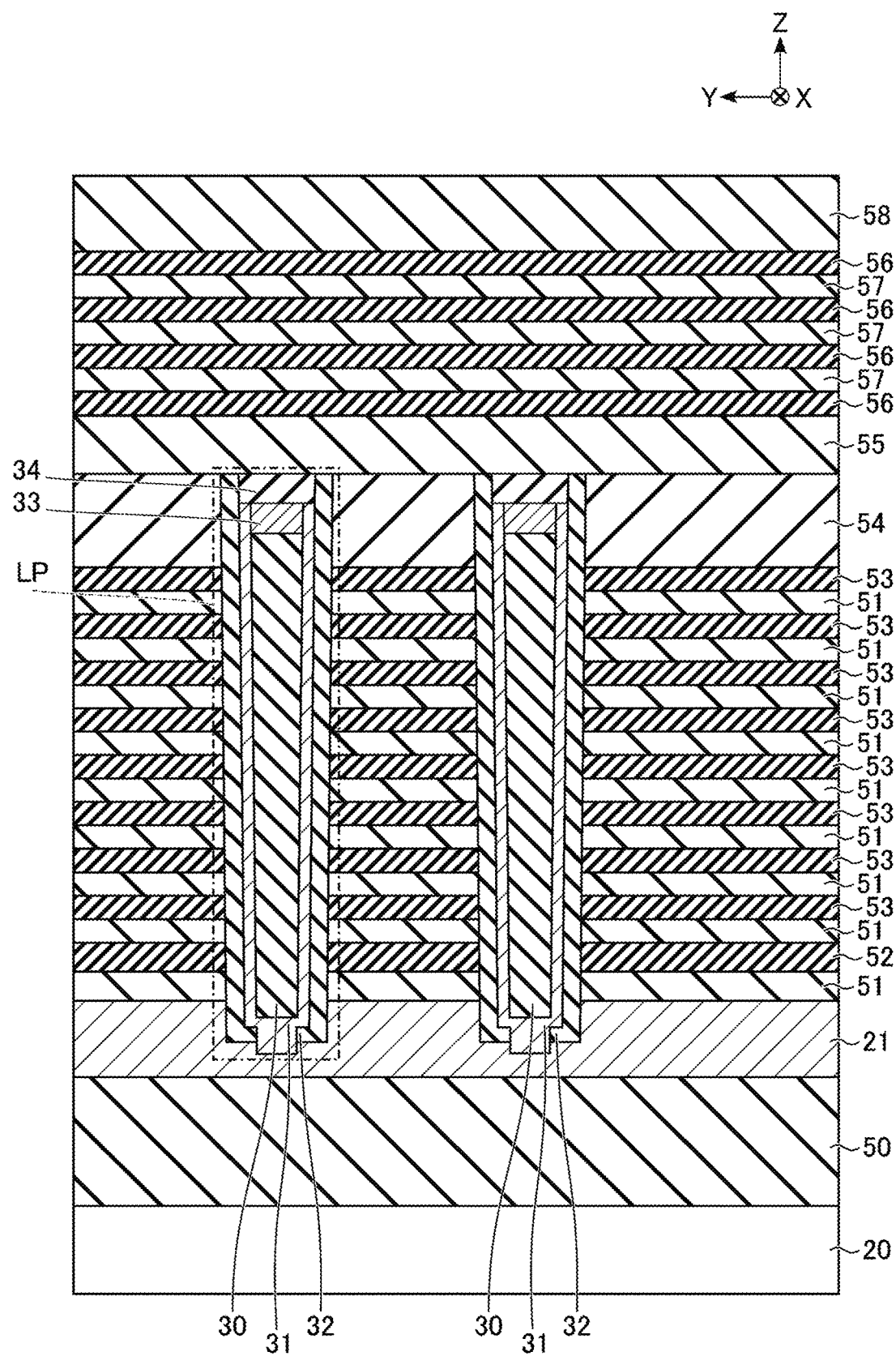
FIG. 11 is a cross-sectional view of the memory cell array illustrating the manufacturing process of the semiconductor memory device of the first embodiment.

Next, as shown in FIG. 11, after an insulator layer 55 is formed on the upper surfaces of the lower pillar LP and the insulator layer 54, a sacrificial material 56 and an insulator layer 57 corresponding to the select gate line SGD are alternately stacked. An insulator layer 58 is formed on an upper layer of the sacrificial material 56 of the uppermost layer. The insulator layers 55, 57, and 58 include silicon oxide, and the sacrificial material 56 includes silicon nitride.

Figure 12:
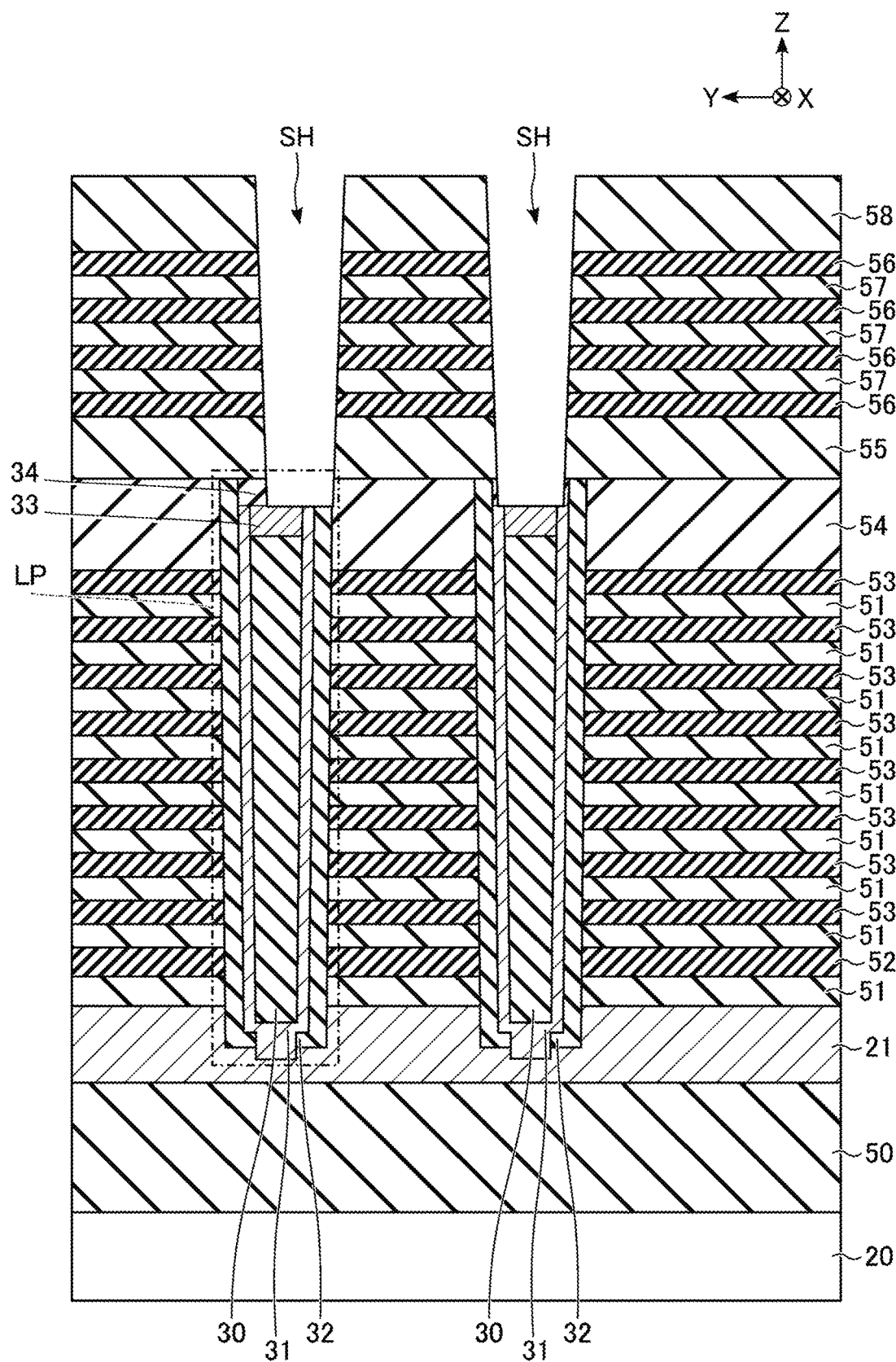
FIG. 12 is a cross-sectional view of the memory cell array illustrating the manufacturing process of the semiconductor memory device of the first embodiment.

Next, as shown in FIG. 12, the SGD hole SH corresponding to the upper pillar UP is formed. Specifically, first, a mask including an opening in a region corresponding to the SGD hole SH is formed by photolithography or the like. The SGD hole SH is formed by anisotropic etching using the formed mask.

The SGD hole SH penetrates the sacrificial material and the insulator portion 34, and reaches the semiconductor portion 33 of the lower pillar LP. The anisotropic etching in the present process is, for example, RIE.

Next, as shown in FIGS. 13 to 17, a stacked structure in the SGD hole SH is formed.

Figure 13:
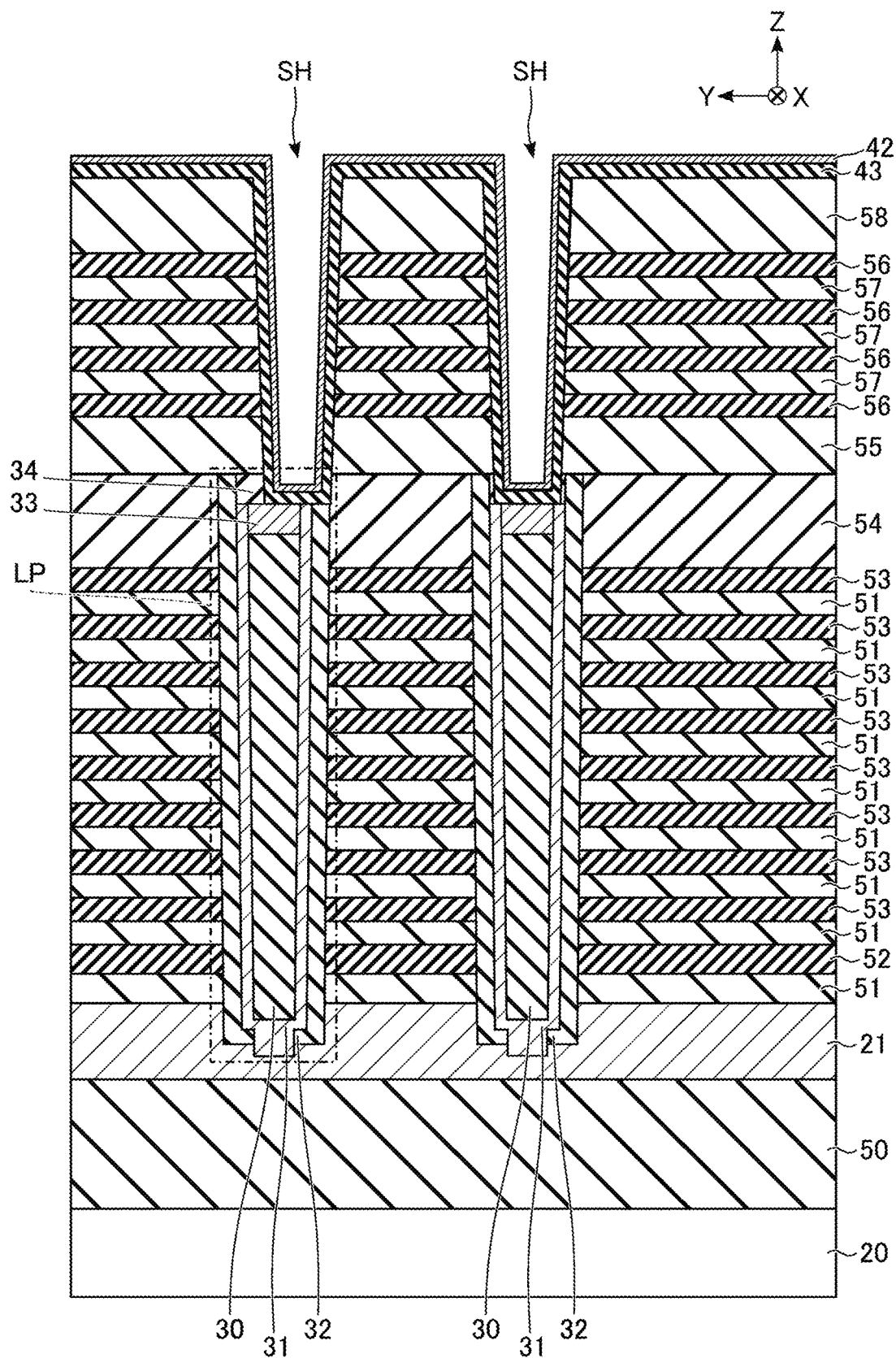
FIG. 13 is a cross-sectional view of the memory cell array illustrating the manufacturing process of the semiconductor memory device of the first embodiment.

Specifically, first, as shown in FIG. 13, the block insulating film 47, the insulating film 46, and the tunnel insulating film 45 are sequentially formed to form the stacked film 43, and then the semiconductor layer 42 is formed.

Figure 14:
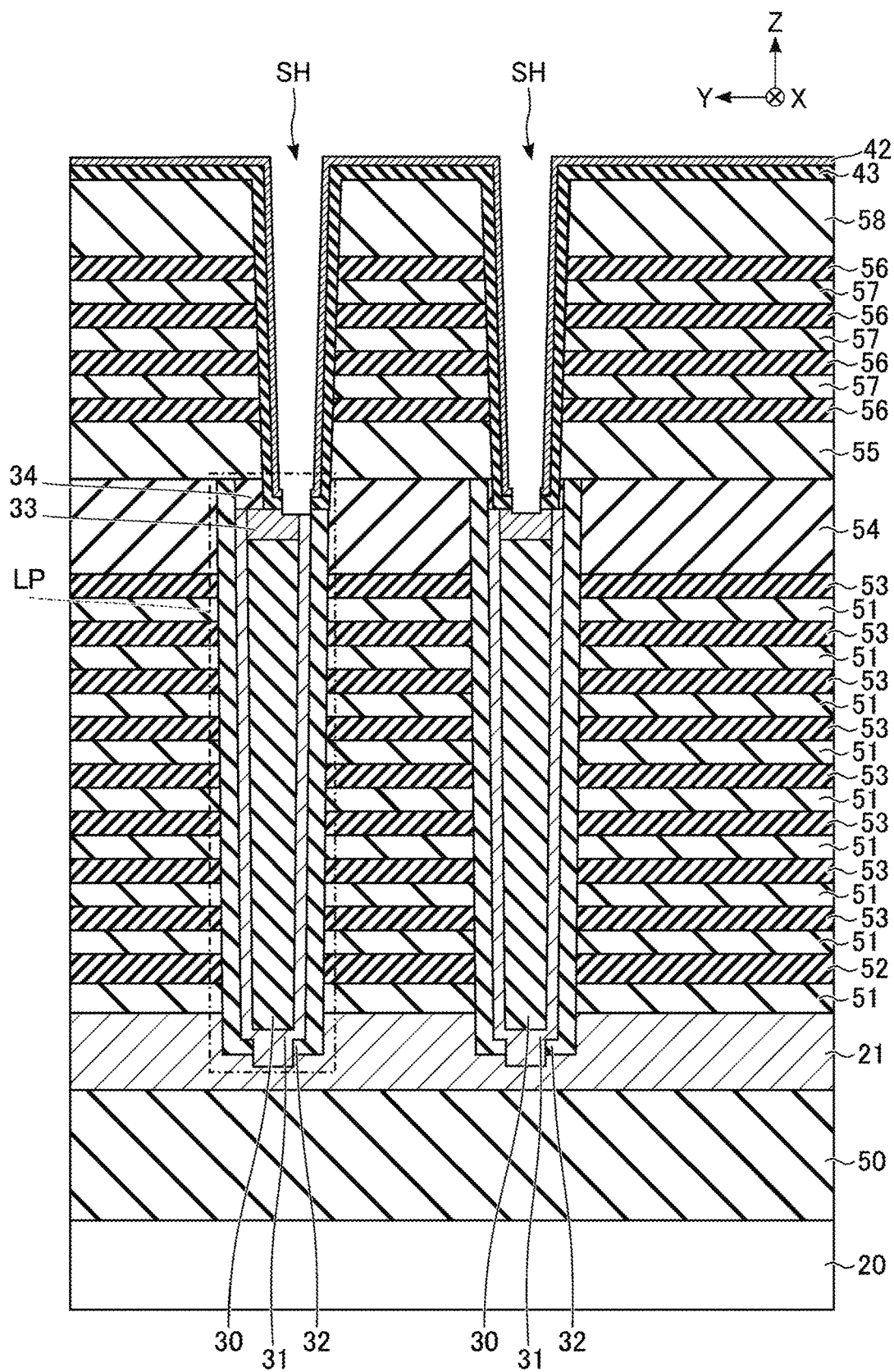
FIG. 14 is a cross-sectional view of the memory cell array illustrating the manufacturing process of the semiconductor memory device of the first embodiment.

As shown in FIG. 14, the semiconductor layer 42 and the stacked film 43 at the bottom portion of the SGD hole SH are removed by anisotropic etching (for example, RIE), and a portion of the stacked film 43 is exposed. In some embodiments, such an exposed portion of the stacked film 43 may be located between the lower end of the semiconductor layer 42 and the upper end of the semiconductor portion 33.

Figure 15:
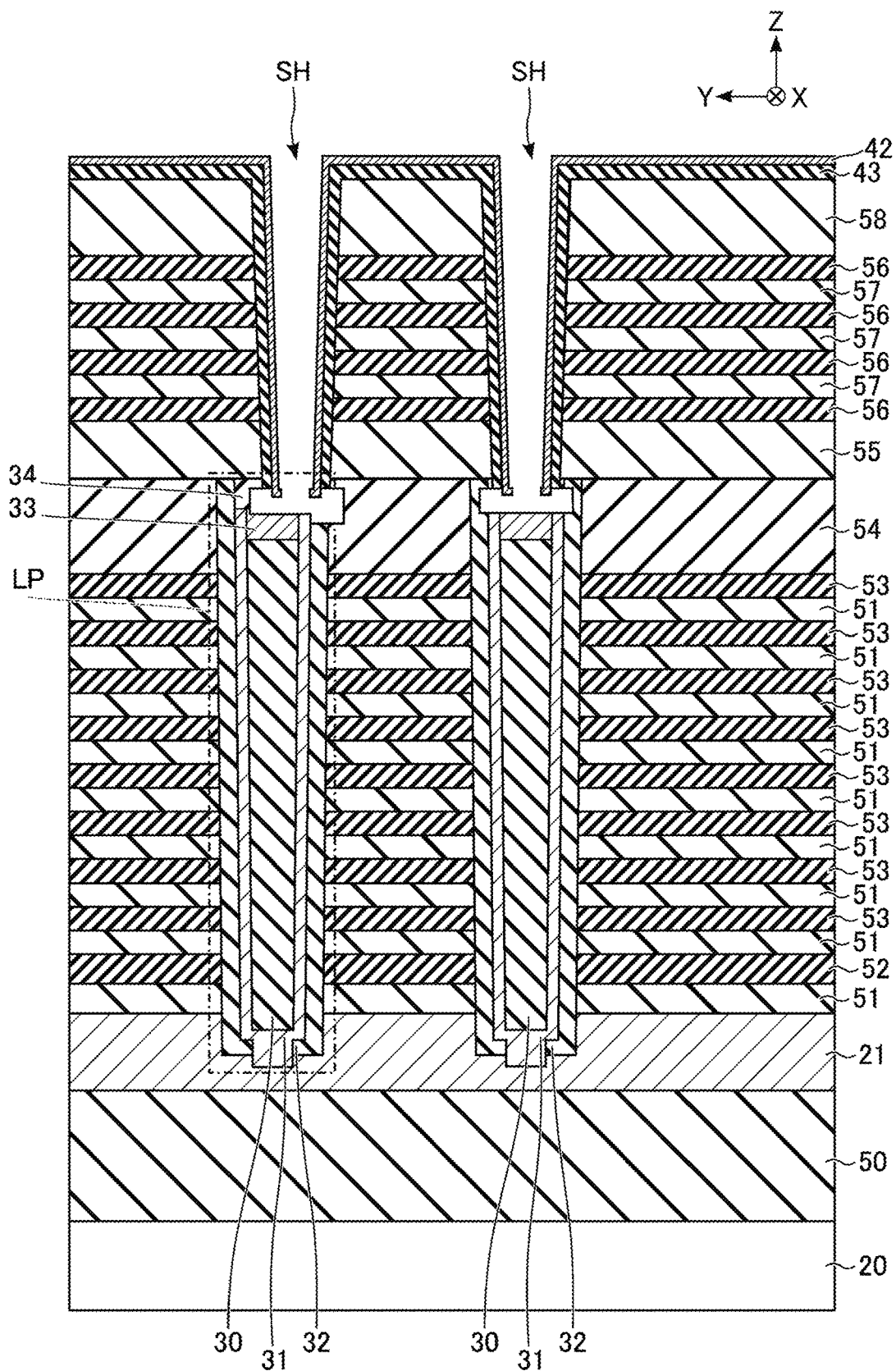
FIG. 15 is a cross-sectional view of the memory cell array illustrating the manufacturing process of the semiconductor memory device of the first embodiment.

As shown in FIG. 15, at least a portion of the stacked film 43 is and a portion or all of the insulator portion 34 are removed by etching. In some embodiments, the etching can be selected to selectively remove oxide and nitride and further direct a direction (lateral direction) along the XY plane. By providing the insulator portion 34, it is possible to form a space extending in an approximately isotropic manner from the center of the SGD hole SH between the lower end of the semiconductor layer 42 and the upper end of the semiconductor portion 33. Here, the corresponding space may be controlled by an appropriate etching time, and a predetermined opening diameter may be secured. For example, the opening diameter is at least larger than the diameter at the lower end of the semiconductor layer 42.

In the etching in the present process, not only the stacked film 43 and the insulator portion 34 but also a part of the stacked film 32 and the insulator layer 54 located substantially in the same layer as the insulator portion 34 may be removed together. In the present disclosure, for example, isotropic etching such as chemical dry etching (CDE) or wet etching may be used. In particular, when the CDE is applied, etching unevenness due to difference of materials (for example, oxide and nitride) in the stacked films 43 and 32 is reduced.

Figure 16:
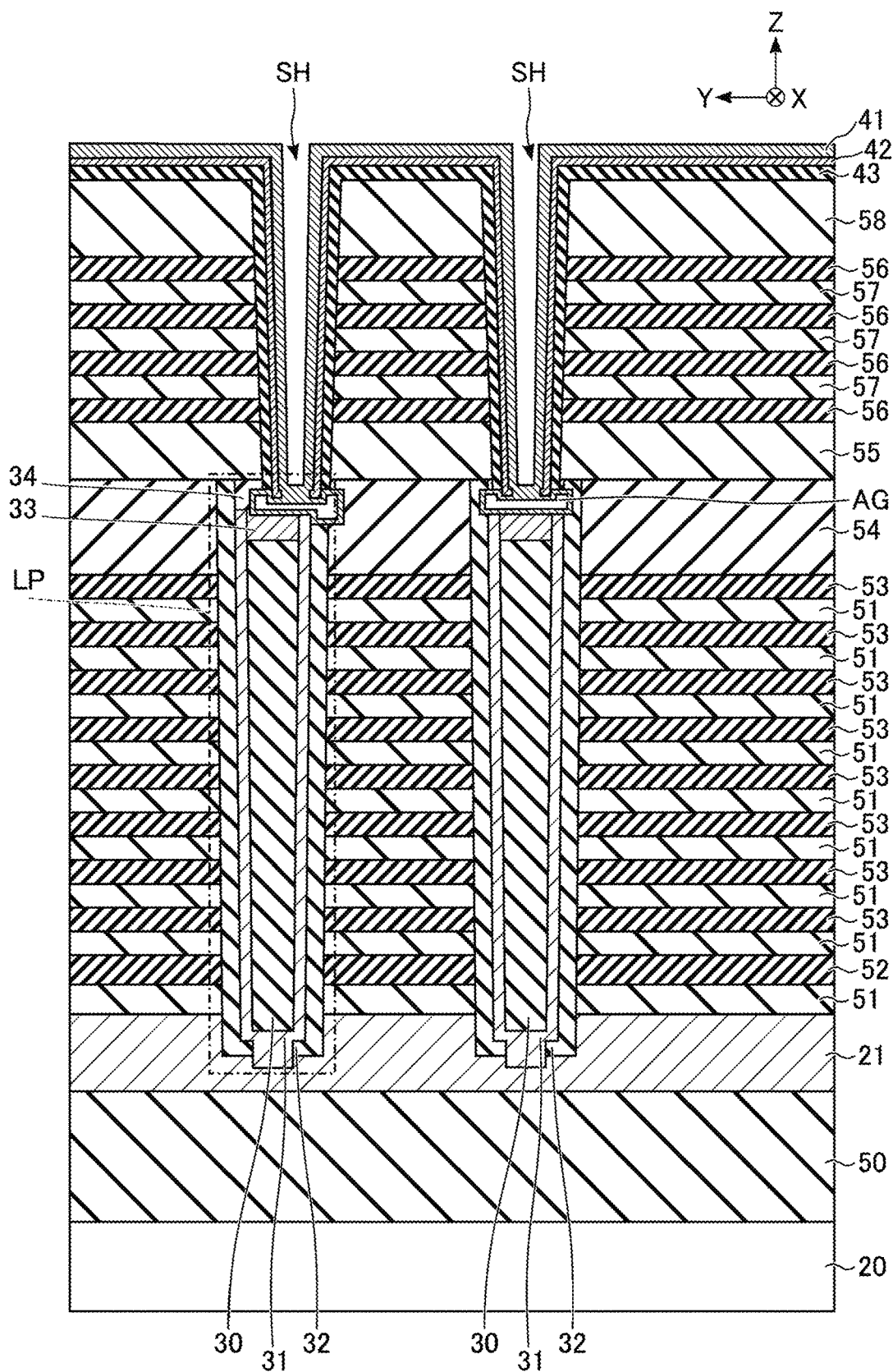
FIG. 16 is a cross-sectional view of the memory cell array illustrating the manufacturing process of the semiconductor memory device of the first embodiment.

As shown in FIG. 16, the semiconductor layer 41 is formed in the SGD hole SH. In the process of forming the semiconductor layer 41, the semiconductor layer 41 closes the SGD hole SH, for example, in a layer between the sacrificial material 56 of the lowermost layer and the semiconductor portion 33. Therefore, the air gap AG surrounded by the semiconductor layer 41 may be formed below a portion of the SGD hole SH that is enclosed by the semiconductor layer 41. The film thickness of the semiconductor layer 41 formed in the air gap AG may be thinner than the film thickness of the semiconductor layer 41 formed above the air gap AG. As described above, in the etching process of FIG. 15, the space of the SGD hole SH is formed wider than the width of the lower end of the semiconductor layer 42, and then the semiconductor layer 41 is formed in the space of the SGD hole SH. The semiconductor layer 41 is in contact with the semiconductor portion 33 and the semiconductor layer 31. The semiconductor layer 31 and the semiconductor layer 41 serve as a current path (channel path) of a cell current flowing in the memory pillar MP.

In some embodiments, in response to the diameter of the SGD hole SH being smaller than the diameter of the memory hole MH, the semiconductor layer 41 is formed to be thinner than the semiconductor layer 31. Therefore, the film thickness of the semiconductor layer 41 covering a side of the air gap AG is thinner than the film thickness of the semiconductor layer 31.

Figure 17:
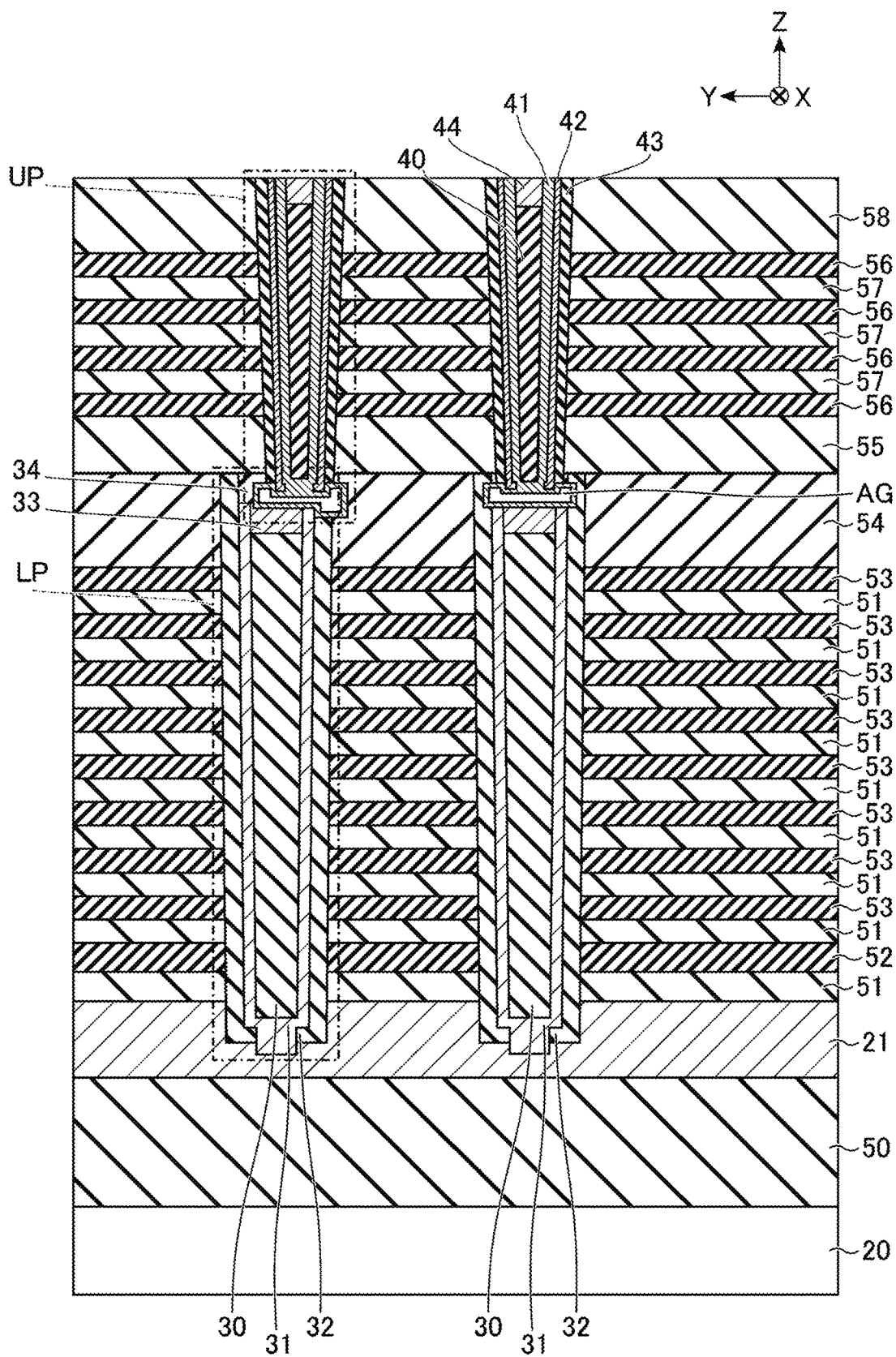
FIG. 17 is a cross-sectional view of the memory cell array illustrating the manufacturing process of the semiconductor memory device of the first embodiment.

As shown in FIG. 17, the core member 40 is formed on the semiconductor layer 41 and in the SGD hole SH. Thereafter, a part of the core member 40 above the SGD hole SH is removed, and the semiconductor portion 44 is buried in the space. The stacked film 43, the semiconductor layer 42, the semiconductor layer 41, the core member 40, and the semiconductor portion 44 remaining on a layer higher than the insulator layer 58 are removed, for example, by CMP. Therefore, the upper pillar UP is formed in the SGD hole SH.

Figure 18:
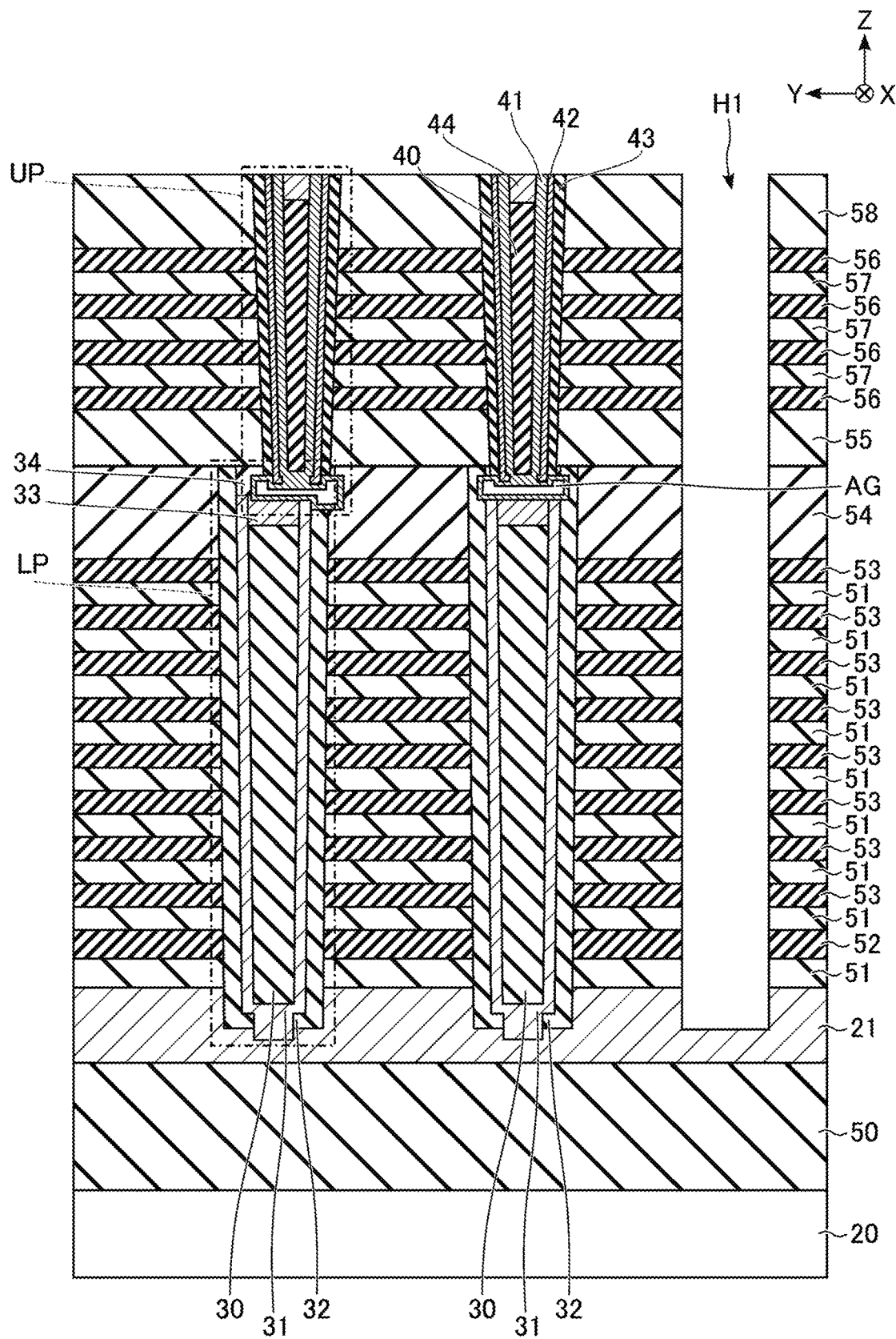
FIG. 18 is a cross-sectional view of the memory cell array illustrating the manufacturing process of the semiconductor memory device of the first embodiment.

Next, as shown in FIG. 18, a hole H1 corresponding to the slit SLT is formed. Specifically, first, a mask including an opening in a region corresponding to the hole H1 is formed by photolithography or the like. The hole H1 is formed by anisotropic etching (for example, RIE) using the formed mask. The hole H1 formed in the present process separates each of the insulator layer 51, the sacrificial materials 52 and 53, the insulator layers 54 and 55, the sacrificial material 56, and the insulator layers 57 and 58.

Next, the sacrificial materials 52, 53 and 56 are replaced with the conductor layers 22 to 24, respectively.

Specifically, first, a surface of the conductor layer 21 exposed in the hole H1 is oxidized to form an oxidation protective film (not shown). Thereafter, for example, the sacrificial materials 52, 53, and 56 are selectively removed by wet etching with hot phosphoric acid. A three-dimensional structure of a structure from which the sacrificial materials 52, 53, and 56 are removed is maintained by the plurality of memory pillars MP and the like.

Figure 19:
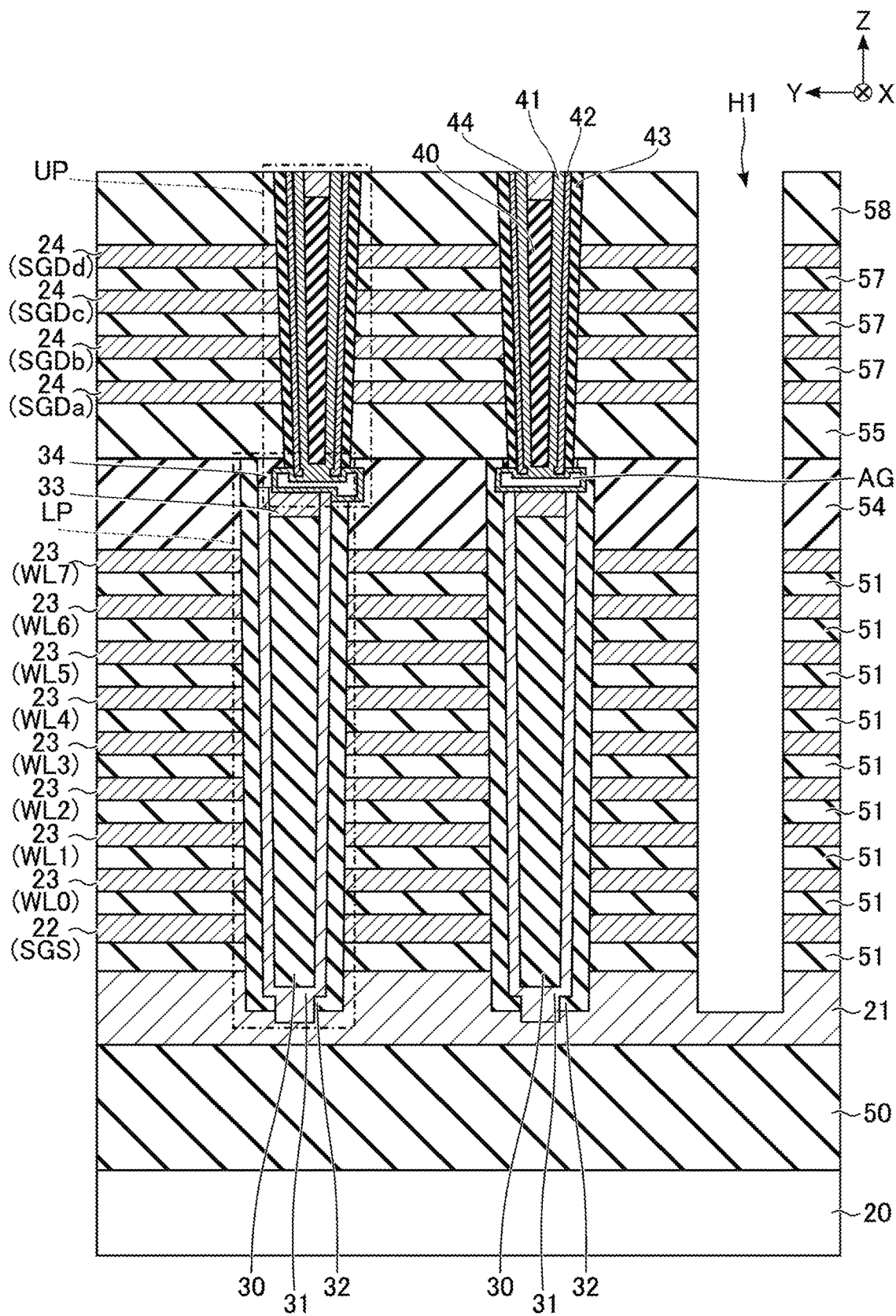
FIG. 19 is a cross-sectional view of the memory cell array illustrating the manufacturing process of the semiconductor memory device of the first embodiment.

As shown in FIG. 19, the conductor is buried in a space from which the sacrificial materials 52, 53 and 56 are removed through the hole H1. For example, CVD is used in the present process. In the conductor, a portion formed in the hole H1 and on an upper surface of the insulator layer 58 is removed by an etch back process. Therefore, the conductors formed in the adjacent wire layers are separated, and the conductor layer 22, the plurality of conductor layers 23, and the conductor layer 24 are formed. The conductor layers 22, 23, and, 24 formed in the present process may include a barrier metal. In this case, in formation of the conductor after the removal of the sacrificial materials 52, 53, and 56, for example, after titanium nitride (TiN) is formed as the barrier metal, tungsten is formed.

Figure 20:
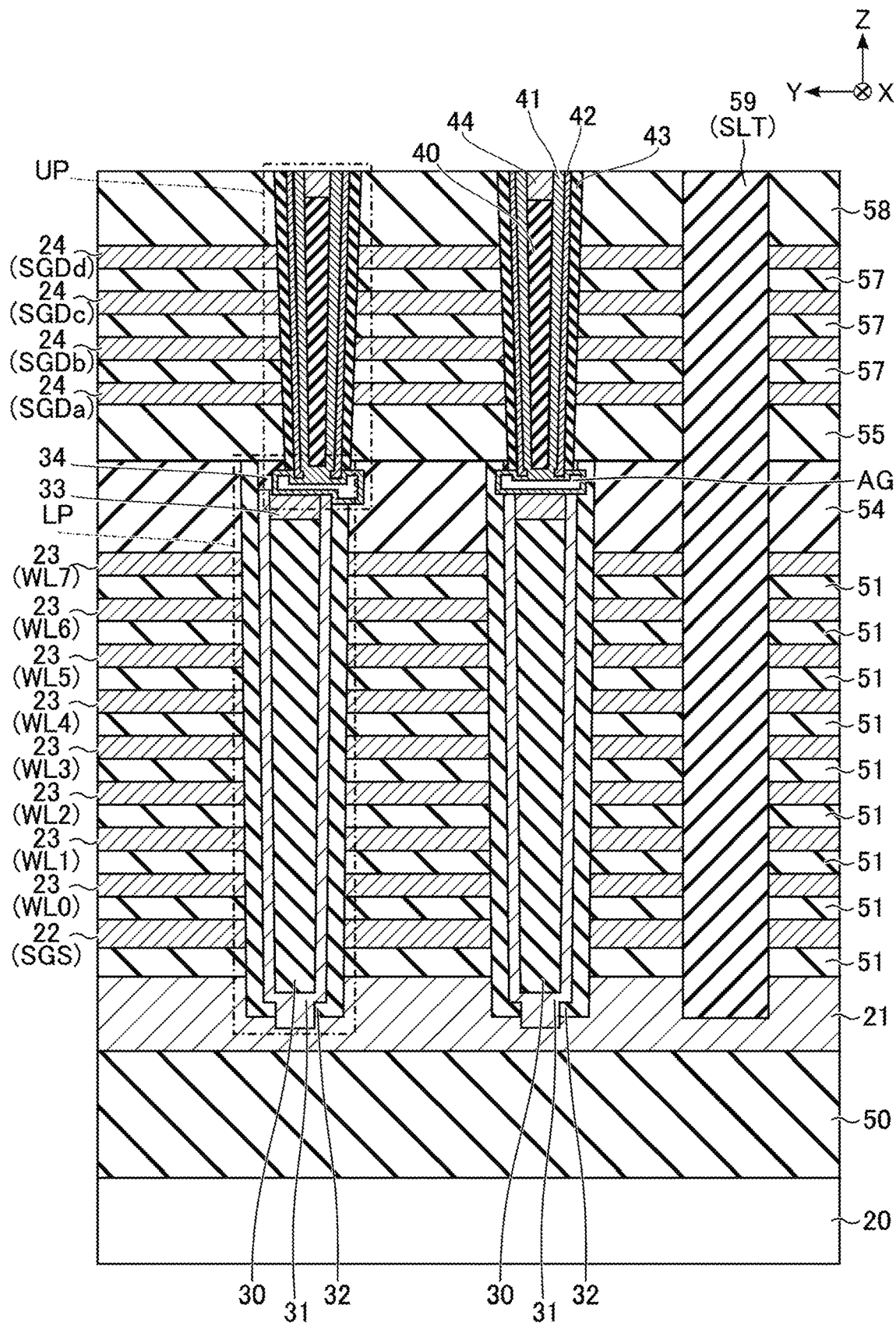
FIG. 20 is a cross-sectional view of the memory cell array illustrating the manufacturing process of the semiconductor memory device of the first embodiment.

Next, as shown in FIG. 20, an insulator layer 59 corresponding to the slit SLT is formed in the hole H1. Specifically, the insulator layer 59 is formed on the insulator layer 58 so that the hole H1 is buried. The insulator layer 59 formed on a layer higher than the insulator layer 58 is removed by, for example, CMP. The insulator layer 59 includes, for example, silicon oxide.

Figure 21:
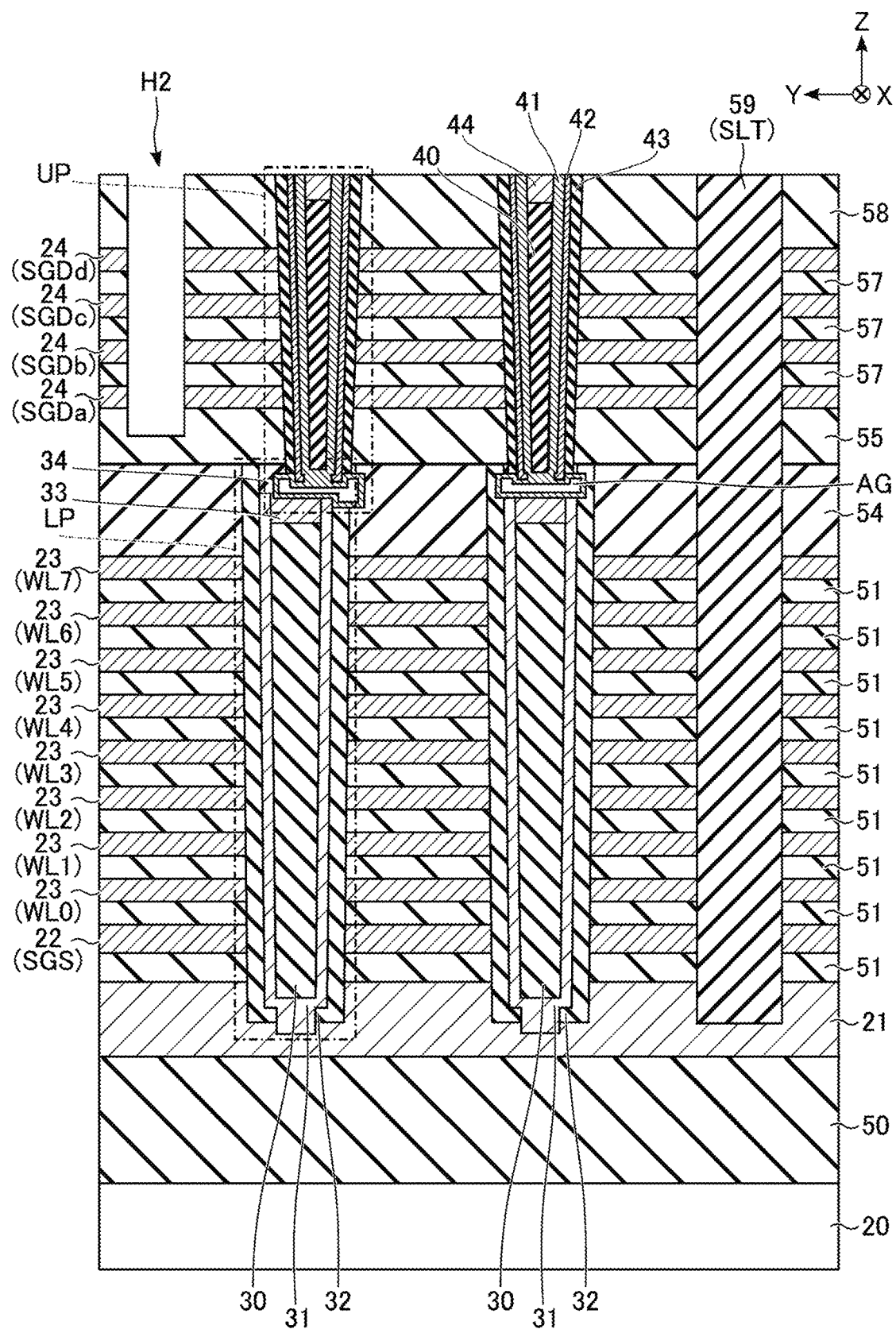
FIG. 21 is a cross-sectional view of the memory cell array illustrating the manufacturing process of the semiconductor memory device of the first embodiment.

Next, as shown in FIG. 21, a hole H2 corresponding to the slit SHE is formed. Specifically, first, a mask including an opening in a region corresponding to the slit SHE is formed by photolithography or the like. The hole H2 is formed by anisotropic etching (for example, RIE) using the formed mask. The hole H2 formed in the present process separates the insulator layers 58 and 57 and the conductor layer 24 and reaches the insulator layer 55.

Figure 22:
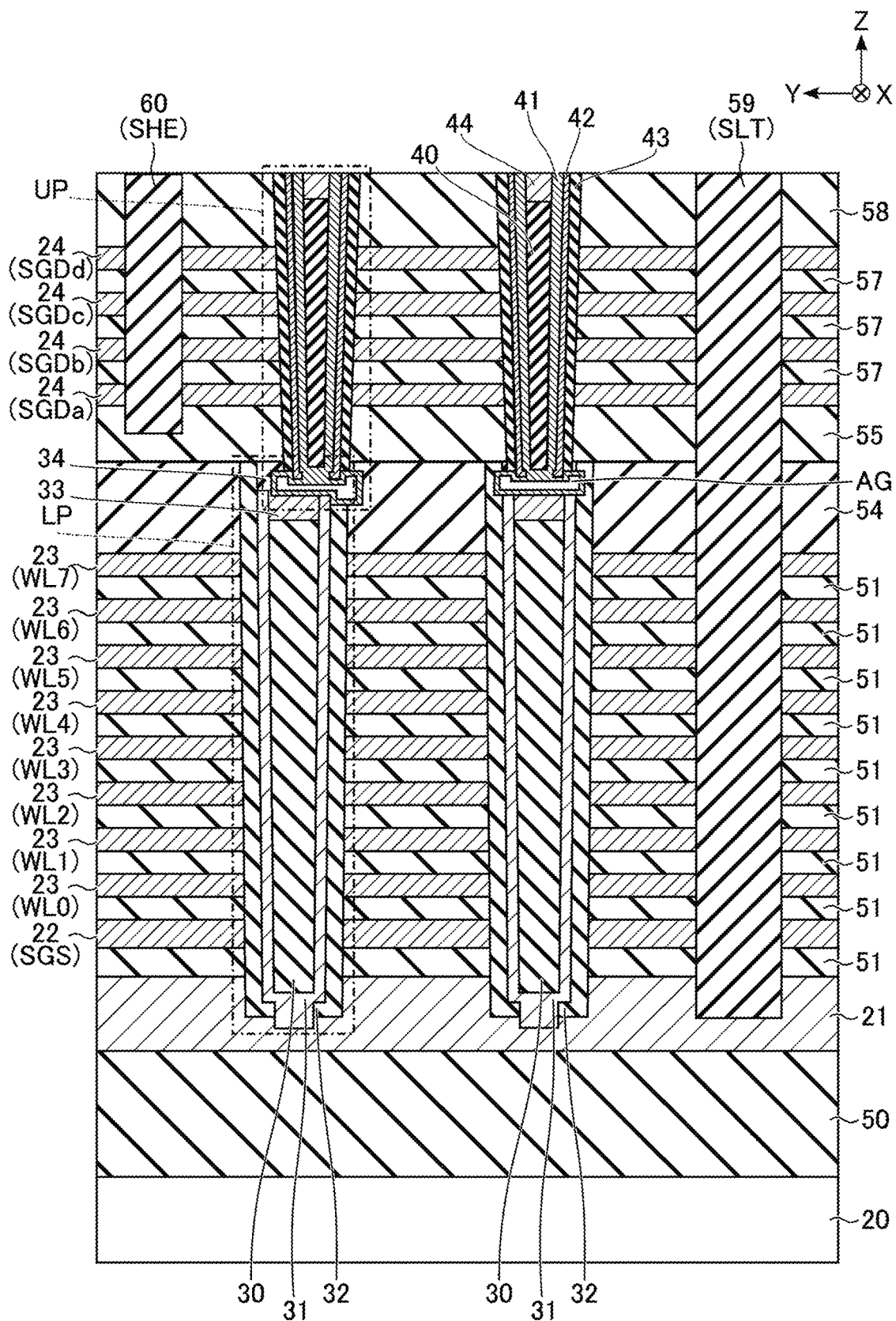
FIG. 22 is a cross-sectional view of the memory cell array illustrating the manufacturing process of the semiconductor memory device of the first embodiment.

Next, as shown in FIG. 22, an insulator layer 60 corresponding to the slit SHE is formed on the insulator layers 58 and 59 so that the hole H2 is buried. The insulator layer 60 formed on a layer higher than the insulator layers 58 and 59 is removed by, for example, an etch back process. The insulator layer 60 includes, for example, silicon oxide.

The memory pillar MP, the source line SL connected to the memory pillar MP, the word line WL, and the select gate lines SGS and SGD are formed by the manufacturing process of the semiconductor memory device according to the first embodiment described above. The manufacturing process described above is merely an example, and other processes may be inserted between each of the manufacturing processes, and the sequence of the manufacturing processes may be changed within a range where no problem occurs.

1.3 Effect of the Present Embodiment

According to the configuration of the first embodiment, even if misalignment occurs between the lower pillar LP and the upper pillar UP, the lower pillar LP and the upper pillar UP may be preferably connected with each other. More specifically, in a connection portion between the lower pillar LP and the upper pillar UP, a contact area between the semiconductor layer 31 of the lower pillar LP and the semiconductor layer 41 of the upper pillar UP is sufficiently ensured, and thus it is possible to preferably connect the lower pillar LP and the upper pillar UP with each other. Therefore, it is possible to reduce the influence of a cell current drop in the current path (channel path) of the connection portion. According to the present embodiment, by providing the insulator portion 34, when forming the space in which the connection portion between the upper and lower pillars is formed by etching, it is possible to control by an appropriate etching time and ensure a predetermined opening diameter.

Figure 23A:
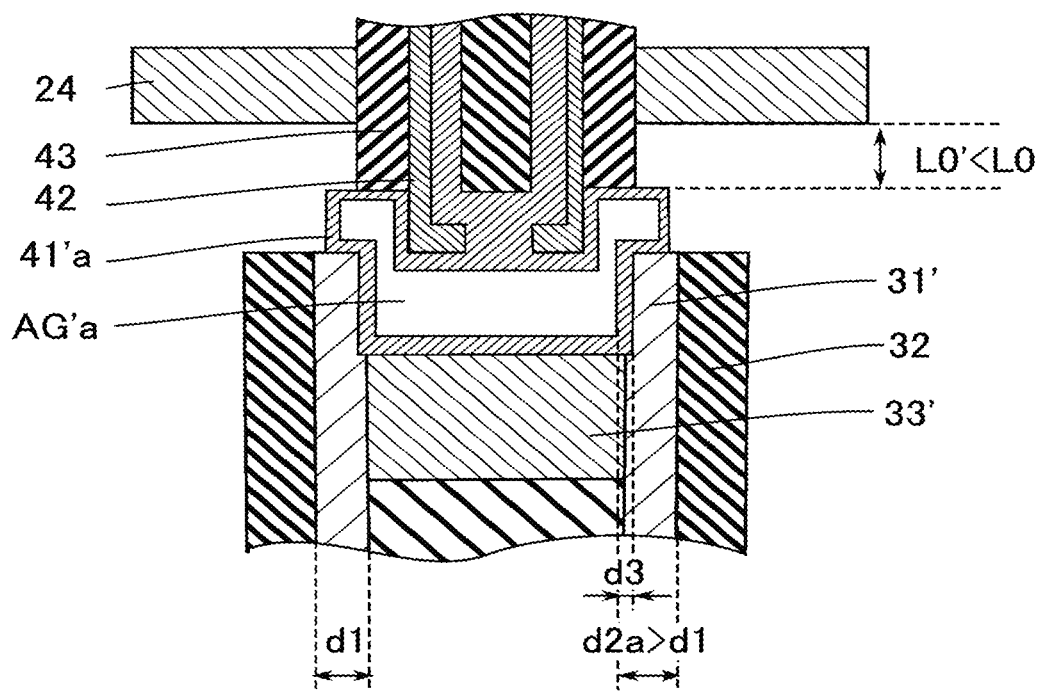
FIGS. 23A and 23B are schematic views of a comparative example illustrating an effect of the semiconductor memory device of the first embodiment.
Figure 23B:
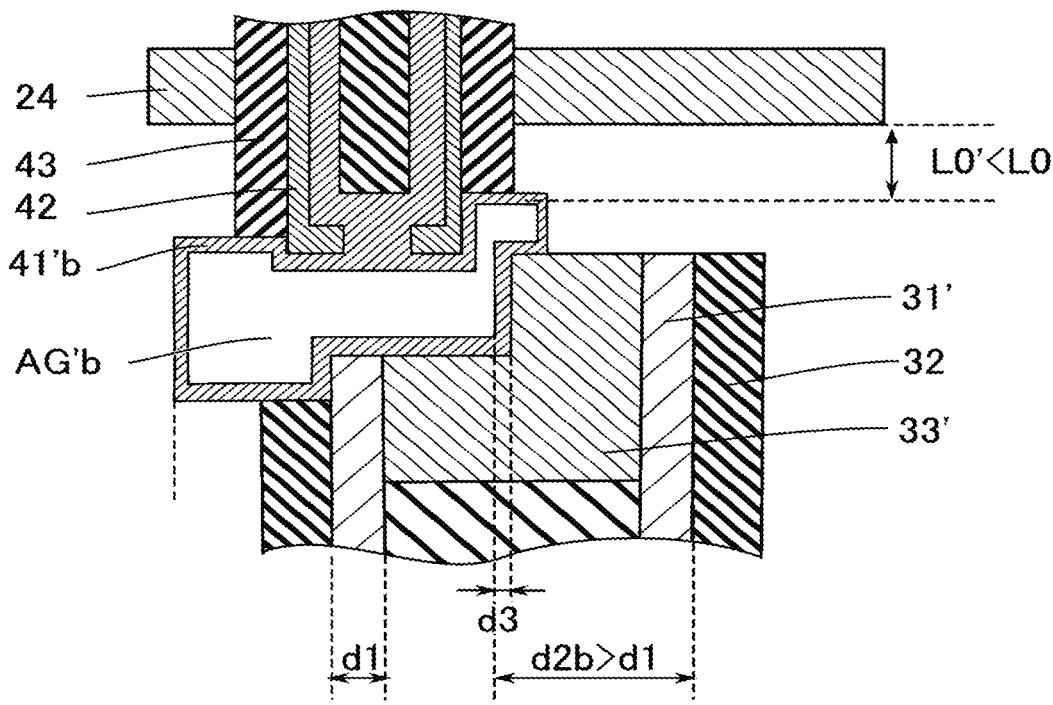

The effect of the present embodiment will be further described using schematic diagrams of FIGS. 23A and 23B. FIGS. 23A and 23B are schematic views of a comparative example illustrating the effect of the semiconductor memory device according to the first embodiment. In the comparative examples of FIGS. 23A and 23B, the insulator portion 34 provided in the first embodiment is not formed at the upper end of the memory hole MH. FIG. 23A shows a case in which the deviation of the axes between the upper pillar UP and the lower pillar LP is relatively small, and FIG. 23B shows a case in which the deviation of the axes between the upper pillar UP and the lower pillar LP is relatively large.

A semiconductor layer 31', a semiconductor portion 33', and a semiconductor layer 4l'a (or 41'b) of FIGS. 23A and 23B correspond to the semiconductor layer 31, the semiconductor portion 33, and the semiconductor layer 41 according to the first embodiment, respectively. The semiconductor layer 31' and the semiconductor portion 33' are formed on the upper end of the lower pillar LP. Thereafter, a process of removing a part of the stacked film formed in the SGD hole SH is performed, and thus the semiconductor layer 4l'a or 41'b is formed. The semiconductor layers 4l'a and 41'b are both formed below the semiconductor layer 42, and an air gap AG'a and an air gap AG'b are formed in the semiconductor layer 4l'a and the semiconductor layer 41'b, respectively.

As can be seen from FIG. 23A, if the deviation of the axes between the upper and lower pillars is small, when the upper pillar UP and the lower pillar LP are viewed in plan from the upper side of the semiconductor substrate 20, in the connection portion of the upper and lower pillars, the upper pillar UP is formed to fit in the cross section of the lower pillar LP. After the process of removing a part of the stacked film 43 of the upper pillar UP buried in the lower pillar LP (the process corresponding to FIG. 14 of the first embodiment), a process of selectively etching the insulator layer in the lateral direction may be performed to expand the space (a process corresponding to FIG. 15 above). In this case, the etching of the stacked film 43 is further progressed along the Z direction, so that the length of the stacked film 43 in the Z direction is reduced.

As can be seen from FIG. 23B, if the deviation of the axes between the upper and lower pillars is large, when the upper pillar UP and the lower pillar LP are viewed in plan from the upper side of the semiconductor substrate 20, in the connection portion of the upper and lower pillars, the upper pillar UP does not fit in the cross section of the lower pillar LP, and a part of the upper pillar UP is formed outside the cross section. After the process of removing a part of the stacked film 43 of the upper pillar UP buried in the lower pillar LP, a process of selectively etching the insulator layer in the lateral direction may be performed to expand the space. In this case, selective etching of the lateral direction is progressed on a portion of an insulator layer where the semiconductor layer 31' and the semiconductor portion 33' are not masked (for example, the insulator layer 54 formed of silicon oxide of FIG. 15). On the other hand, the semiconductor layer 31', the semiconductor portion 33', and the semiconductor layer 42 including, for example, silicon are not etched, so that it is difficult to progress the etching of the portion of the insulator layer where the semiconductor layer 31', the semiconductor portion 33', and the semiconductor layer 42 are masked. For example, although a part of the stacked film 43 including the insulating film 46 including silicon nitride (SiN) is etched along the Z direction, it is difficult to progress the etching compared to the insulator layer (the insulator layer 54) etched in the lateral direction.

Thereafter, although the semiconductor layers 41'a and 41'b are formed to form a film, in order to preferably connect to the semiconductor layer 31' of the lower pillar LP, securing a predetermined distance in the Z direction may be desired. However, in either case of FIGS. 23A and 23B, as described above, since the progress of the etching in the Z direction of the stacked film 43 is slow, the etching time tends to be long when attempting to secure a preferable connection.

In this case, the semiconductor layer 42 and the stacked film 43 in the portion CH of the SGD hole SH may be exposed to an etching gas or a chemical solution for a long time, and the gate insulating film of the select transistor ST1 may be damaged. If the etching of the stacked film 43 is excessively progressed, since a length of the gate of the select transistor becomes shorter than expected, a threshold characteristic changes, which affects a breakdown voltage or a cutoff characteristic of the select transistor.

As described above, in order to obtain a preferable connection between the upper pillar UP and the lower pillar LP, the structure and the manufacturing process in the portion JP of the upper pillar UP that is in contact with the lower pillar LP may be desired. In particular, portions of the semiconductor layers 41'a and 41'b corresponding to the portion JT of the upper pillar UP are portions where the semiconductor layer 31' of the lower pillar LP is connected to the semiconductor layers 41'a and 41'b corresponding to the portion CH of the upper pillar UP, and are connection portions of the current path between the memory cell of the lower pillar LP and the bit line BL. Therefore, the cell current may also be affected.

According to the first embodiment, the upper ends of the semiconductor layer 31 and the semiconductor portion 33 are located below the upper end of the stacked film 32, and the insulator portion 34 is formed on the side of the stacked film 43 of the upper pillar UP buried in the lower pillar LP. Therefore, when forming the space in which the connection portion between the upper and lower pillars is formed by etching, it is possible to ensure the predetermined opening diameter by the appropriate etching time without hindrance to lateral etching by the semiconductor portion 33 and the semiconductor layer 31.

FIG. 23B shows a comparative example in which the deviation of axes is large between the upper and lower pillars. In this case, for example, the large deviation occurs in such a way that the semiconductor film thickness d2 (d2b) corresponding to the distance (deviation) between the air gap AG' and the stacked film 32 is larger than the thickness d1 of the semiconductor layer 31' by the thickness d3 of the semiconductor layer 41' and the thickness of a part of the semiconductor portion 33'. FIG. 23A shows a case in which the axis deviation is small. In this case, the film thickness d2 (d2a) is substantially the same as the film thickness d1. The upper end of the semiconductor layer 31' of the memory pillar MP (a tip portion of the semiconductor layer 31' at the maximum height from the semiconductor substrate 20) is also substantially the same height as the upper end of the stacked film 32.

On the other hand, in the first embodiment, as shown in FIG. 4, if the deviation of axes between the upper and lower pillars is large (for example, in a case of two memory pillars MP in the center of the drawing), in a side portion of the air gap AG in which the connection portion between the upper and lower pillars is formed, the semiconductor layer 41 is in contact with any of the insulator portion 34, the stacked film 32, and the insulator layer 54 without being in contact with the semiconductor layer 31 and the semiconductor portion 33. Therefore, according to the first embodiment, the film thickness of the semiconductor between the air gap AG and the stacked film 32 is thinner than the film thickness of the semiconductor between the core member and the stacked film 32. The upper end of the semiconductor layer 31 of the memory pillar MP (the tip portion of the semiconductor layer 31 of the maximum height from the semiconductor substrate 20) is lower than the upper end of the stacked film 32 because the insulator portion 34 is present immediately above the semiconductor layer 31. In other words, the upper end of the stacked film 32 protrudes above the semiconductor layer 31.

2. Modified Example and the Like

The first embodiment described above may be variously modified.

For example, in the first embodiment described above, for example, a case in which the threshold voltage of the select transistor ST2 may be adjusted by the stacked film 43 including the tunnel insulating film 45, the insulating film 46, and the block insulating film 47 is described as an example, while the present disclosure is not limited thereto. For example, the stacked film 43 may not include the tunnel insulating film 45 and the insulating film 46. In this case, even if wet etching is applied when the lower portion of the semiconductor layer 42 is etched, the difference in etching rate due to the material in the stacked film 43 is reduced.

In the first embodiment described above, a case in which the semiconductor memory device 1 has the structure in which the circuits such as the sense amplifier module 16 are provided below the memory cell array 10 is described as an example, while the present disclosure is not limited thereto. For example, the semiconductor memory device 1 may have a structure in which the memory cell array 10 and the sense amplifier module 16 are formed on the semiconductor substrate 20. The semiconductor memory device 1 may have a structure in which a chip provided with the sense amplifier module 16 and the like and a chip provided with the memory cell array 10 are bonded together.

In the first embodiment described above, the structure in which the word line WL and the select gate line SGS are adjacent to each other, and the word line WL and the select gate line SGD are adjacent to each other is described, while the present disclosure is not limited thereto. For example, a dummy word line may be provided between the word line WL of the uppermost layer and the select gate line SGD. Similarly, a dummy word line may be provided between the word line WL of the lowermost layer and the select gate line SGS. In a structure in which a plurality of pillars is connected, the conductor layer nearby the connection portion may be used as the dummy word line.

In the first embodiment described above, a case in which the semiconductor layer 31 and the conductor layer 21 are electrically connected with each other through the bottom portion of the memory pillar MP is exemplified, while the present disclosure is not limited thereto. The semiconductor layer 31 and the conductor layer 21 may be electrically connected with each other through the side surface of the memory pillar MP. In this case, a part of the stacked film 32 formed on the side surface of the memory pillar MP is removed, and a structure in which the semiconductor layer 31 and the conductor layer 21 are in contact with each other through the corresponding portion is formed.

In the present disclosure, "film thickness" indicates, for example, a difference between an inner diameter and an outer diameter of the component formed in the memory hole MH or the SGD hole SH. The "inner diameter" and the "outer diameter" of a layer mean averages of inner diameters and outer diameters of the corresponding layer in cross section in the XY plane, respectively. The term "diameter" may be used to mean any of "inner diameter" and "outer diameter".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of first conductor layers stacked in a first direction;
   a second conductor layer provided above the uppermost layer of the plurality of first conductor layers;
   a first semiconductor layer extending in the first direction through the plurality of first conductor layers;
   a second semiconductor layer including a first portion extending in the first direction through the second conductor layer and a second portion of which a diameter in a cross section orthogonal to the first direction is larger than a diameter of the first portion, the first semiconductor layer in contact with the second portion of the second semiconductor layer; and
   a first charge storage layer disposed between the plurality of first conductor layers and the first semiconductor layer, wherein
   the first charge storage layer extends in the first direction beyond an upper end of the first semiconductor layer.

2. The semiconductor memory device according to claim 1, further comprising:
   a first insulator layer disposed between the first semiconductor layer and the second conductor layer, and disposed between the first charge storage layer and the second portion of the second semiconductor layer.

3. The semiconductor memory device according to claim 1, wherein
   the second portion of the second semiconductor layer includes an air gap.

4. The semiconductor memory device according to claim 1, wherein
   a diameter of the first semiconductor layer is larger than the diameter of the first portion of the second semiconductor layer.

5. The semiconductor memory device according to claim 2, wherein
   the first insulator layer includes silicon oxide or silicon nitride.

6. The semiconductor memory device according to claim 1, further comprising:
   a second insulator layer disposed between the second conductor layer and the first portion of the second semiconductor layer, wherein
   the second insulator layer includes a second charge storage layer.

7. The semiconductor memory device according to claim 1, wherein
a thickness of the second portion of the second semiconductor layer is less than a thickness of a portion of the first semiconductor layer disposed in the plurality of first conductor layers and along the first charge storage layer.

8. A semiconductor memory device comprising:
a plurality of first conductor layers stacked in a first direction;
a second conductor layer provided above the plurality of first conductor layers;
a first semiconductor layer extending in the first direction through the plurality of first conductor layers;
a second semiconductor layer including a first portion extending in the first direction through the second conductor layer and a second portion with a diameter in a cross section orthogonal to the first direction being larger than a diameter of the first portion, the second semiconductor layer in contact with the first semiconductor layer via the second portion;
a first charge storage layer disposed between the plurality of first conductor layers and the first semiconductor layer; and
a first insulator layer disposed between the first semiconductor layer and the second conductor layer, the first insulator in contact with the second portion of the second semiconductor layer.

9. A method of manufacturing a semiconductor memory device, the method comprising:
forming a first stacked body including a plurality of first sacrificial materials stacked in a first direction;
forming a first hole extending through the plurality of first sacrificial materials;
sequentially forming a first insulator layer, a first semiconductor layer, and a first core in the first hole;
removing at least a portion of the first core formed in the first hole to form a first space, the portion of the first core extending from an upper end of the first stacked body to a first depth;
forming a second semiconductor layer in the first space;
removing a portion of the first semiconductor layer and a portion of the second semiconductor layer formed in the first hole to form a second space, the portion of the first semiconductor layer and the portion of the second semiconductor layer extending from the upper end of the first stacked body to a second depth, the second depth being shallower than the first depth; and
forming a second insulator layer in the second space.

10. The method according to claim 9, further comprising:
forming a second sacrificial material above the first stacked body, and forming a second hole penetrating the second sacrificial material and the second insulator layer to expose at least a portion of the second semiconductor layer;
sequentially forming a third insulator layer and a third semiconductor layer in the second hole, and removing a portion of the third semiconductor layer formed at a lower portion of the second hole to expose the third insulator layer;
removing the third insulator layer below the third semiconductor layer and at least a portion of the second insulator layer through the exposed third insulator layer; and
forming a fourth semiconductor layer in the second hole.

11. The method according to claim 10, wherein
the fourth semiconductor layer includes a first portion extending in the first direction in the second sacrificial material, and a second portion of which a diameter in a cross section orthogonal to the first direction is larger than a diameter of the first portion.

12. The method according to claim 11, wherein
the second portion of the fourth semiconductor layer includes an air gap inside.

13. The method according to claim 11, wherein
the second insulator layer is disposed between the second semiconductor layer and the second sacrificial material, and is disposed between the first insulator layer and the second portion of the fourth semiconductor layer.

14. The method according to claim 10, wherein
a diameter of the first hole is larger than a diameter of the second hole.

15. The method according to claim 10, further comprising:
forming a third hole penetrating the second sacrificial material and the first sacrificial material;
replacing the first sacrificial material with a first conductor layer through the third hole and replacing the second sacrificial material with a second conductor layer; and
forming a fourth insulator layer in the third hole.

16. The method according to claim 15, further comprising:
forming a fourth hole penetrating the second conductor layer; and
forming a fifth insulator layer in the fourth hole.

* * * * *